US009378562B1

(12) United States Patent
Ciolfi et al.

(10) Patent No.: US 9,378,562 B1
(45) Date of Patent: Jun. 28, 2016

(54) MANAGEMENT OF VARIANTS IN A GRAPHICAL MODELING ENVIRONMENT

(71) Applicant: The MathWorks, Inc., Natick, MA (US)

(72) Inventors: John E. Ciolfi, Wellesley, MA (US); Sanjai Singh, Bangalore (IN); Amar Nath Satrawala, Bangalore (IN)

(73) Assignee: The MathWorks, Inc., Natick, MA (US)

( * ) Notice: Subject to any disclaimer, the term of this patent is extended or adjusted under 35 U.S.C. 154(b) by 664 days.

(21) Appl. No.: 13/724,620

(22) Filed: Dec. 21, 2012

(51) Int. Cl.
 G06F 7/60 (2006.01)
 G06T 11/00 (2006.01)
 G06T 17/00 (2006.01)

(52) U.S. Cl.
 CPC ............... G06T 11/00 (2013.01); G06T 17/00 (2013.01)

(58) Field of Classification Search
 CPC ....... G06F 17/5009; G06F 8/34; G06F 8/443; G06F 8/10; G06F 9/4433
 See application file for complete search history.

(56) References Cited

U.S. PATENT DOCUMENTS

| 6,096,094 | A * | 8/2000 | Kay et al. ...................... 717/168 |
| 6,965,800 | B2 * | 11/2005 | Schmit et al. ..................... 700/29 |
| 7,509,244 | B1 * | 3/2009 | Shakeri ................. G06F 9/5044 703/13 |
| 7,742,903 | B2 | 6/2010 | Ciolfi et al. ........................ 703/6 |
| 2004/0210592 | A1 * | 10/2004 | Ciolfi et al. .................... 707/101 |
| 2005/0278162 | A1 * | 12/2005 | Ciolfi et al. ...................... 703/22 |
| 2006/0229742 | A1 * | 10/2006 | Boutin et al. ..................... 700/32 |
| 2008/0092111 | A1 * | 4/2008 | Kinnucan et al. ............. 717/105 |
| 2008/0294406 | A1 * | 11/2008 | Hachmeister .................... 703/11 |
| 2009/0044180 | A1 * | 2/2009 | Luszczek ................. G06F 8/314 717/149 |
| 2009/0044197 | A1 * | 2/2009 | Stefansson .............. G06F 8/314 718/106 |
| 2009/0049435 | A1 * | 2/2009 | Luszczek ................. G06F 8/314 717/149 |
| 2009/0254801 | A1 * | 10/2009 | Pressman .................. G06F 8/10 715/205 |
| 2010/0153910 | A1 * | 6/2010 | Ciolfi et al. .................... 717/105 |
| 2010/0175045 | A1 * | 7/2010 | Ciolfi et al. .................... 717/105 |
| 2011/0067017 | A1 * | 3/2011 | Ghosh-Roy et al. .......... 717/155 |
| 2011/0252411 | A1 * | 10/2011 | Martin et al. ................. 717/149 |
| 2012/0084695 | A1 * | 4/2012 | Higgins et al. ................ 715/771 |
| 2014/0278307 | A1 * | 9/2014 | Hosey ....................... G06F 8/71 703/6 |

OTHER PUBLICATIONS

Atasu et al.("Automatic Application—Specific Instruction—Set Extensions under Microarchitectural Constraints" ACM, 2003, pp. 256-261).*
Frey et al.("An Extensible Arcbitecture for Detecting Violations of a Cloud Environment. Constraints During Legacy Software System Migration" IEEE, 2011, pp. 269-278).*

* cited by examiner

Primary Examiner — Omar Fernandez Rivas
Assistant Examiner — Iftekhar Khan
(74) Attorney, Agent, or Firm — Harrity & Harrity, LLP

(57) ABSTRACT

A device receives variants associated with a model generated in a graphical modeling environment, and determines a hierarchy of the variants based on a hierarchy of the model. The device receives mode information for the variants, where the mode information includes a subset of a number of variant permutations. For each mode, the device receives control variables for the variants and optional constraints for the variants in the mode. The control variables define which variants are active, and the optional constraints ensure modeling correctness by enabling identification of conflicts between the variants. The device generates a variant manager tool based on the hierarchy of the variants, the mode information, the control variables, and the optional constraints, and outputs or stores variant information via the variant manager tool.

22 Claims, 21 Drawing Sheets

OVERVIEW

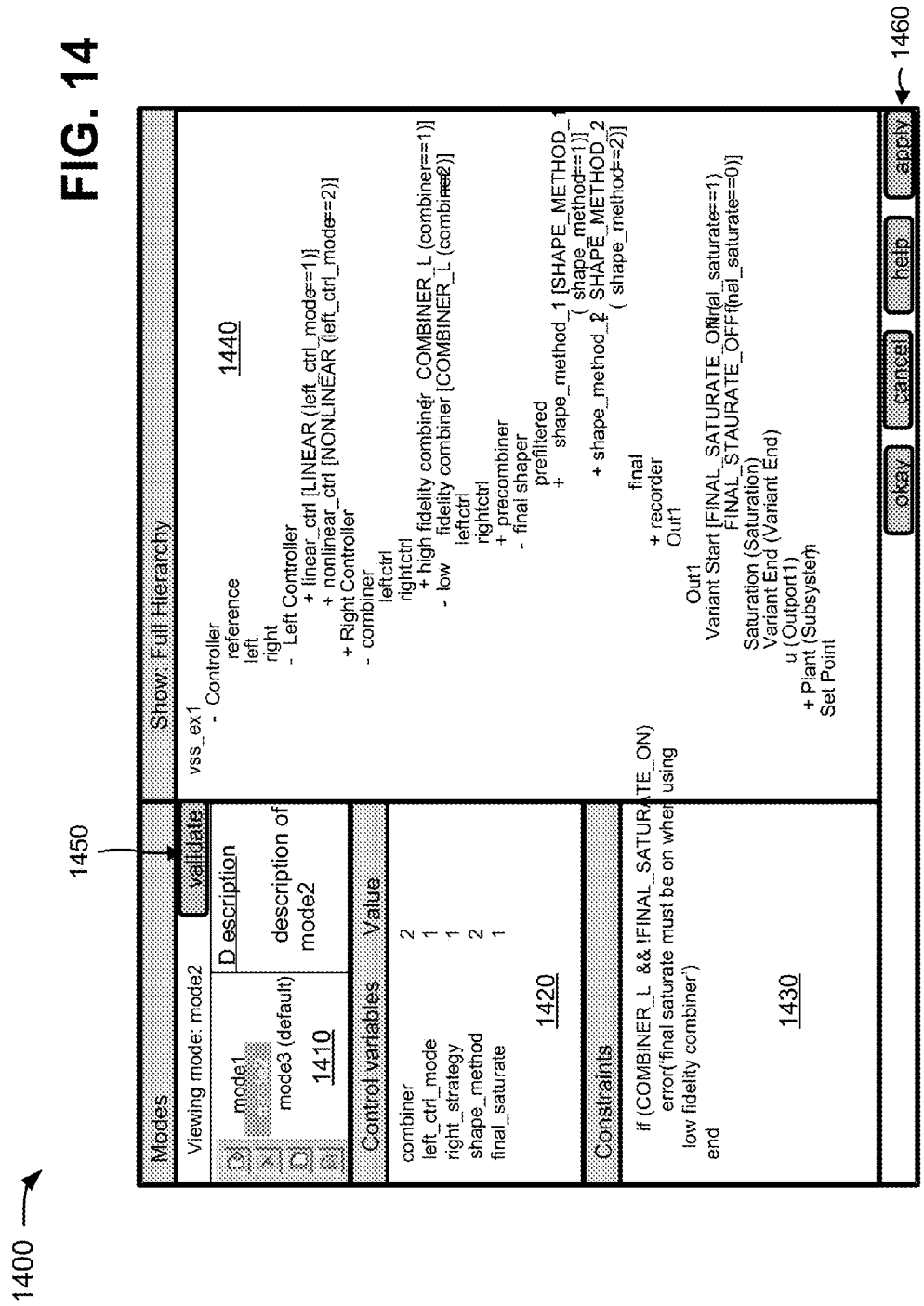

FIG. 15

Modes

Viewing mode: mode2 | Description | validate
--- | --- | ---
☐ mode1 | |
☑ mode2 | description of mode2 |
☐ mode3 (default) | |

1410

Control variables | Value

| | |
|---|---|
| combiner | 2 |
| left_ctrl_mode | 1 |
| right_strategy | 1 |
| shape_method | 2 |
| final_saturate | 1 |

1420

Constraints

```
if (COMBINER_L && !FINAL_SATURATE_ON)
  error('final saturate must be on when using
  low fidelity combiner')
end
```

1430

Show Variant Hierarchy

```
vss_ex1                                                        1440
  - Controller
     - Left Controller
        + linear_ctrl [LINEAR (left_ctrl_mode==1)]
        + nonlinear_ctrl [NONLINEAR (left_ctrl_mode==2)]
     + Right Controller
     - combiner
        + high fidelity combiner COMBINER_L (combiner==1)]
        - low fidelity combiner [COMBINER_L (combiner==2)]
          - final shaper
            + shape_method_1 [SHAPE_METHOD_1
                             (shape_method==1)]
            + shape_method_2  SHAPE_METHOD_2
                             (shape_method==2)]
  Variant Start [FINAL_SATURATE_ON(final_saturate==1)
                 FINAL_STAURATE_OFF(final_saturate==0)]
  Variant End (Variant End)
                                                 ← 1510
```

[okay] [cancel] [help] [apply]

MANAGEMENT OF VARIANTS IN A GRAPHICAL MODELING ENVIRONMENT

BRIEF DESCRIPTION OF THE DRAWINGS

The accompanying drawings, which are incorporated in and constitute a part of this specification, illustrate one or more implementations and, together with the description, explain these implementations. In the drawings:

FIGS. 7-18 are diagrams of example user interfaces capable of being generated by the variant manager component of FIGS. 5 and 6.

DETAILED DESCRIPTION

The following detailed description refers to the accompanying drawings. The same reference numbers in different drawings may identify the same or similar elements.

A technical computing environment (TCE) may provide a computing environment that allows users to perform tasks related to disciplines, such as, but not limited to, mathematics, science, engineering, medicine, business, etc., more efficiently than if the tasks were performed in another type of computing environment, such as an environment that requires the user to develop code in a conventional programming language, such as C++, C, Fortran, Pascal, etc. In one example, a TCE may include a dynamically-typed programming language (e.g., the M language, a MATLAB® language, a MATLAB-compatible language, a MATLAB-like language, etc.) that can be used to express problems and/or solutions in mathematical notations.

The TCE may provide a graphical programming or modeling environment (e.g., a block diagram environment) that includes variants. The variants may enable an individual portion (e.g., a block, an element, a component, a module, etc.) of a graphical model to have multiple implementations that may be swapped in and out by a user of the TCE. Within the modeling environment, a block (e.g., a subsystem, a model reference, etc.) may have multiple variants that are programmatically controlled. For a large-scale model, a number of variants may become extremely large. Thus, a number of possible variant permutations for the model may be high, and the model may be difficult to manage. This may adversely affect how quickly the model is developed, as well as the model's integrity.

Overview

Systems and/or methods described herein may provide for management of variants in a graphical modeling environment. In one example, the systems and/or methods may manage the variants by providing defined modes that are subsets of variant permutations, and by enabling the modes to be displayed and/or navigated. The systems and/or methods may enable constraints to be defined for the variants to ensure that incompatible variant selections are identified.

Figure 1:
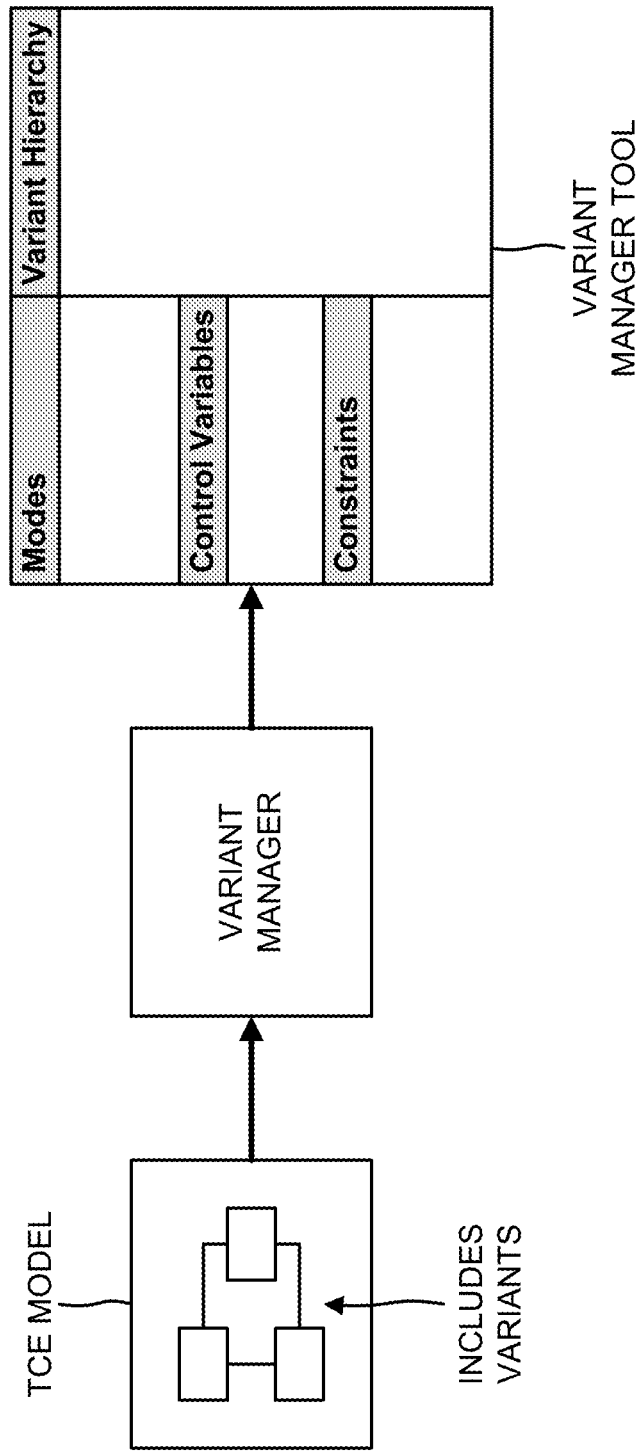
FIG. 1 is a diagram of an overview of an example implementation described herein.

FIG. 1 is a diagram of an overview of an example implementation described herein. As shown in FIG. 1, a computing environment, such as a technical computing environment (TCE), may include a variant manager component (also referred as a "variant configuration manager component"). The variant manager component may receive a model generated by the TCE. The TCE model may include a block diagram model with one or more model elements (e.g., blocks), one or more inputs, and one or more outputs. Each of the model elements may include a representation (e.g., a block) of a hardware device, a system, a subsystem, etc. of a system being modeled by the TCE. In one example, the TCE model may include multiple variants that enable an individual portion of the TCE model to have multiple implementations that may be swapped in and out by a user of the TCE.

The variant manager component may determine a hierarchy of the variants included in the TCE model, and may determine modes for the variants included in the TCE model. The hierarchy of the variants may include a listing of the variants provided in an order according to the hierarchy of elements of the TCE model with which the variants are associated. A mode (or configuration) of the variant manager may include a subset of a number of variant permutations. The variant manager component may determine control variables for the variants, and may determine constraints for the variants. The control variables may include variables used to control which variants are active in the TCE model. The constraints may ensure that incompatible variant selections are identified. The variant manager component may generate a variant manager tool based on the hierarchy of the variants, the modes for the variants, the control variables for the variants, and/or the constraints for the variants.

The variant manager component may output (e.g., display) and/or store the variant manager tool. In one example, as shown in FIG. 1, the variant manager tool may include a variant hierarchy section (e.g., a window) for displaying the hierarchy of the variants, and a modes section for displaying the modes for the variants. Alternatively, or additionally, the variant manager tool may include a control variables section that displays the control variables for the variants, and a constraints section that displays the constraints for the variants.

The terms "code" and "program code," as used herein, are to be used interchangeably and are to be broadly interpreted to include text-based code that may not require further processing to execute (e.g., C++ code, Hardware Description Language (HDL) code, very-high-speed integrated circuits (VHSIC) HDL(VHDL) code, Verilog, Java, and/or other types of hardware or software based code that may be compiled and/or synthesized); binary code that may be executed (e.g., executable files that may directly be executed by an operating system, bitstream files that can be used to configure a field programmable gate array (FPGA), Java byte code, object files combined together with linker directives, source code, makefiles, etc.); text files that may be executed in conjunction with other executables (e.g., Python text files, a collection of dynamic-link library (DLL) files with text-based combining, configuration information that connects pre-compiled modules, an extensible markup language (XML) file describing module linkage, etc.); etc. In one example, code may include different combinations of the above-identified classes (e.g., text-based code, binary code, text files, etc.). Alternatively, or additionally, code may include code generated using a dynamically-typed programming language (e.g., the M language, a MATLAB® language, a MATLAB-compatible language, a MATLAB-like language, etc.) that can be used to express problems and/or solutions in mathematical notations. Alternatively, or additionally, code may be of any type, such as function, script, object, etc., and a portion of code may include one or more characters, lines, etc. of the code.

Example Environment Arrangement

Figure 2:
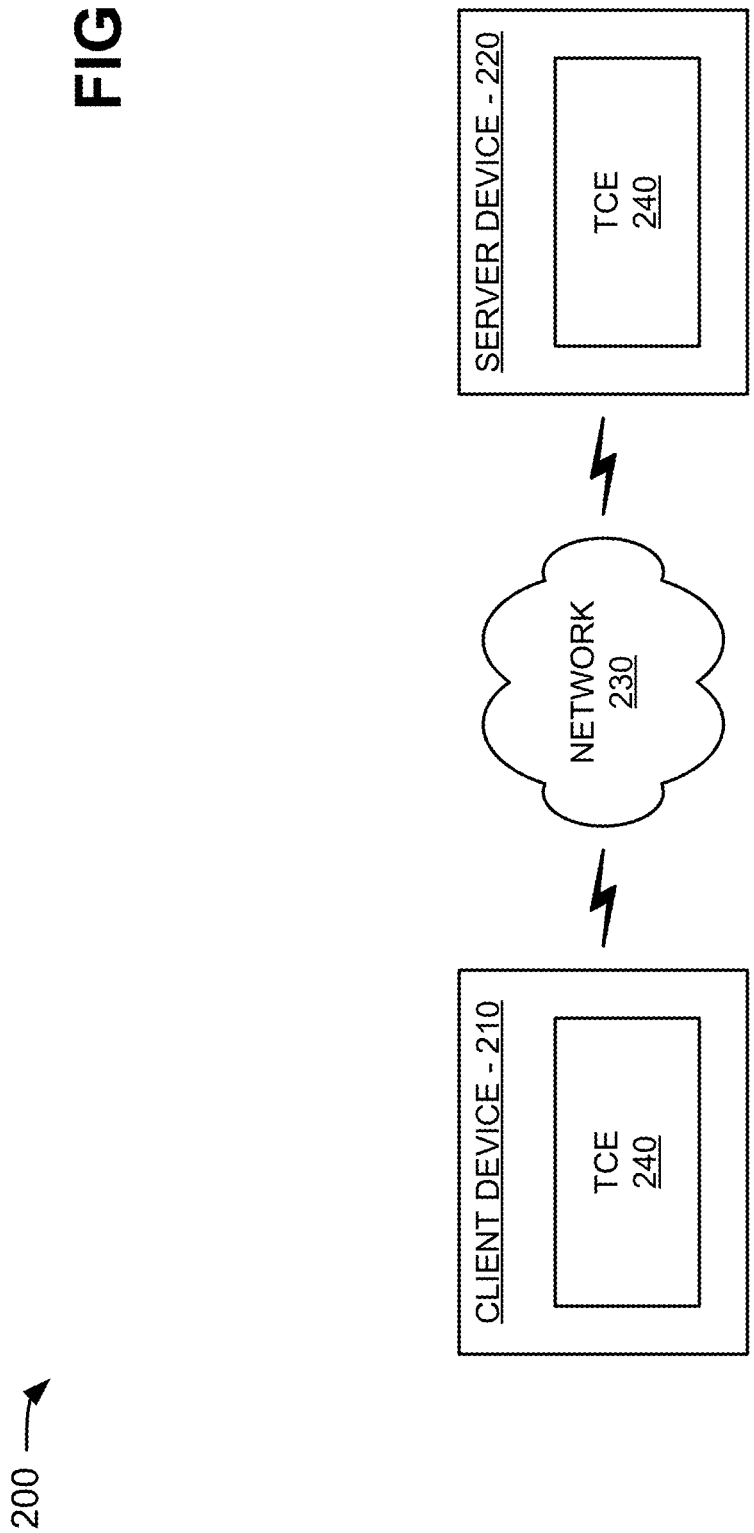
FIG. 2 is a diagram of an example environment in which systems and/or methods described herein may be implemented.

FIG. 2 is a diagram of an example environment 200 in which systems and/or methods described herein may be implemented. As illustrated, environment 200 may include a client device 210 interconnected with a server device 220 via a network 230. Components of environment 200 may interconnect via wired and/or wireless connections. A single client device 210, server device 220, and network 230 have been illustrated in FIG. 2 for simplicity. In practice, environment 200 may include more client devices 210, server devices 220, and/or networks 230. In one example implementation, client device 210 and server device 220 may be provided in a single device or may be provided in separate devices.

Client device 210 may include one or more devices that are capable of communicating with server device 220 via network 230. For example, client device 210 may include a laptop computer, a personal computer, a tablet computer, a desktop computer, a workstation computer, a smart phone, a personal digital assistant (PDA), and/or other computation and communication devices.

Server device 220 may include one or more server devices, or other types of computation and communication devices, that gather, process, and/or provide information in a manner described herein. Server device 220 may include a device that is capable of communicating with client device 210 (e.g., via network 230). In one example, server device 220 may include one or more laptop computers, personal computers, workstation computers, servers, central processing units (CPUs), graphical processing units (GPUs), application-specific integrated circuits (ASICs), field-programmable gate arrays (FPGAs), etc. and/or software (e.g., a simulator) executing on the aforementioned devices. In one example, server device 220 may include TCE 240 and may perform some or all of the functionality described herein for client device 210. Alternatively, server device 220 may be omitted and client device 210 may perform all of the functionality described herein for client device 210.

Network 230 may include a network, such as a local area network (LAN), a wide area network (WAN), a metropolitan area network (MAN), a telephone network, such as the Public Switched Telephone Network (PSTN), an intranet, the Internet, or a combination of networks.

TCE 240 may be provided within a computer-readable medium of client device 210. Alternatively, or additionally, TCE 240 may be provided in another device (e.g., server device 220) that is accessible by client device 210. TCE 240 may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In one implementation, TCE 240 may include a dynamically-typed programming language (e.g., the M language, a MATLAB® language, a MATLAB-compatible language, a MATLAB-like language, etc.) that can be used to express problems and/or solutions in mathematical notations.

For example, TCE 240 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In addition, TCE 240 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

TCE 240 may further provide mathematical functions and/or graphical tools (e.g., for creating plots, surfaces, images, volumetric representations, etc.). In one implementation, TCE 240 may provide these functions and/or tools using toolboxes (e.g., toolboxes for signal processing, image processing, data plotting, parallel processing, etc.). Alternatively, or additionally, TCE 240 may provide these functions as block sets or in another way, such as via a library, etc.

TCE 240 may be implemented as a text-based environment (e.g., MATLAB software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; aspects of a Unified Modeling Language (UML) or SysML environment; etc.); or another type of environment, such as a hybrid environment that includes one or more of the above-referenced text-based environments and one or more of the above-referenced graphically-based environments.

TCE 240 may include a programming language (e.g., the MATLAB language) that may be used to express problems and/or solutions in mathematical notations. The programming language may be dynamically typed and/or array-based. In a dynamically typed array-based computing language, data may be contained in arrays and data types of the data may be determined (e.g., assigned) at program execution time.

For example, suppose a program, written in a dynamically typed array-based computing language, includes the following statements:
A='hello'
A=int32([1, 2])
A=[1.1, 2.2, 3.3].
Now suppose the program is executed, for example, in a TCE, such as TCE 240. During run-time, when the statement "A='hello'" is executed the data type of variable "A" may be a string data type. Later when the statement "A=int32([1, 2])" is executed the data type of variable "A" may be a 1-by-2 array containing elements whose data type are 32 bit integers. Later, when the statement "A=[1.1, 2.2, 3.3]" is executed, since the language is dynamically typed, the data type of variable "A" may be changed from the above 1-by-2 array to a 1-by-3 array containing elements whose data types are floating point. As can be seen by this example, data in a program written in a dynamically typed array-based computing language may be contained in an array. Moreover, the data type of the data may be determined during execution of the program. Thus, in a dynamically type array-based computing language, data may be represented by arrays and data types of data may be determined at run-time.

TCE 240 may provide mathematical routines and a high-level programming language suitable for non-professional programmers and may provide graphical tools that may be used for creating plots, surfaces, images, volumetric representations, or other representations. TCE 240 may provide these routines and/or tools using toolboxes (e.g., toolboxes for signal processing, image processing, data plotting, parallel processing, etc.). TCE 240 may also provide these routines in other ways, such as, for example, via a library, local or remote database (e.g., a database operating in a computing cloud), remote procedure calls (RPCs), and/or an application programming interface (API). TCE 240 may be configured to improve runtime performance when performing computing operations. For example, TCE 240 may include a just-in-time (JIT) compiler.

Although FIG. 2 shows example components of environment 200, in other implementations, environment 200 may include fewer components, different components, differently arranged components, and/or additional components than those depicted in FIG. 2. Alternatively, or additionally, one or more components of environment 200 may perform one or more other tasks described as being performed by one or more other components of environment 200.

Example Device Architecture

Figure 3:
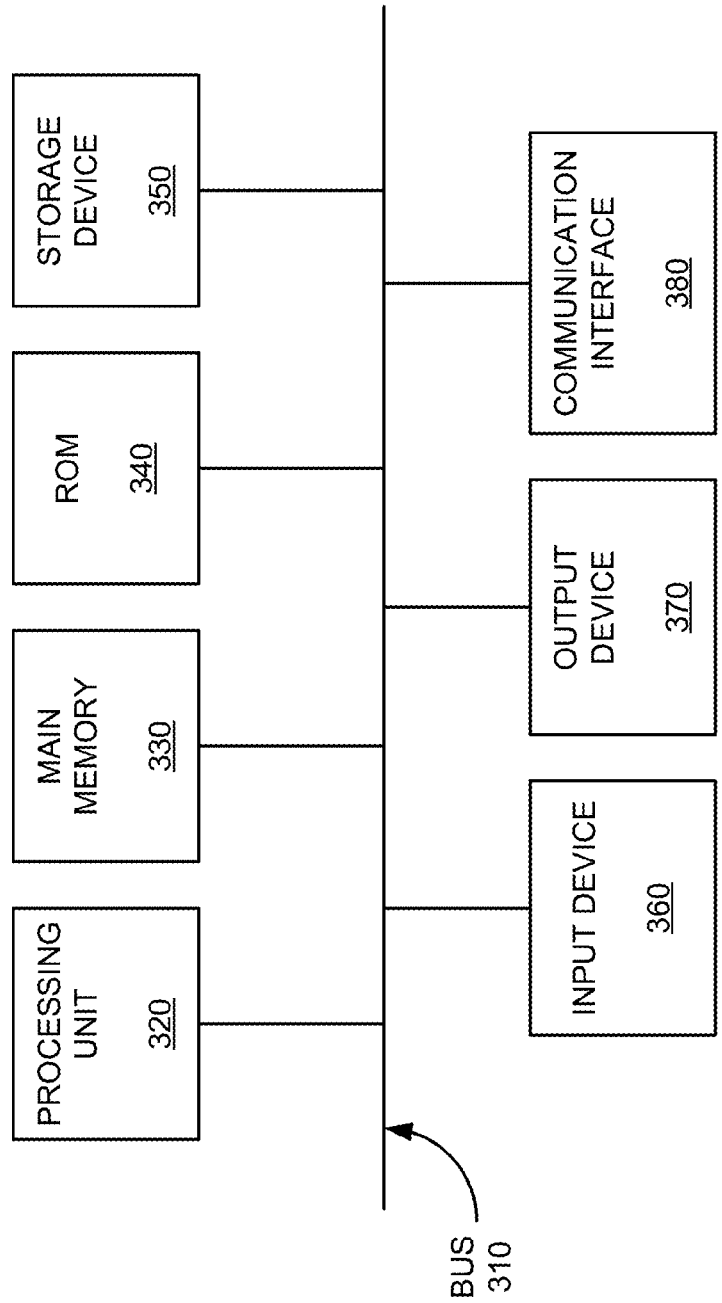
FIG. 3 is a diagram of example components of one or more of the devices of the environment depicted in FIG. 2.

FIG. 3 is an example diagram of a device 300 that may correspond to one or more of the devices of environment 200. As illustrated, device 300 may include a bus 310, a processing unit 320, a main memory 330, a read-only memory (ROM) 340, a storage device 350, an input device 360, an output device 370, and/or a communication interface 380. Bus 310 may include a path that permits communication among the components of device 300.

Processing unit 320 may include one or more processors, microprocessors, or other types of processing units that may interpret and execute instructions. Main memory 330 may include one or more random access memories (RAMs) or other types of dynamic storage devices that may store information and/or instructions for execution by processing unit 320. ROM 340 may include one or more ROM devices or other types of static storage devices that may store static information and/or instructions for use by processing unit 320. Storage device 350 may include a magnetic and/or optical recording medium and its corresponding drive.

Input device 360 may include a mechanism that permits a user to input information to device 300, such as a keyboard, a camera, an accelerometer, a gyroscope, a mouse, a pen, a microphone, voice recognition and/or biometric mechanisms, a remote control, a touch screen, a neural interface, etc. Output device 370 may include a mechanism that outputs information to the user, including a display, a printer, a speaker, etc. Communication interface 380 may include any transceiver-like mechanism that enables device 300 to communicate with other devices, networks, and/or systems. For example, communication interface 380 may include mechanisms for communicating with another device or system via a network.

As described herein, device 300 may perform certain operations in response to processing unit 320 executing software instructions contained in a computer-readable medium, such as main memory 330. A computer-readable medium may be defined as a non-transitory memory device. A memory device may include space within a single physical memory device or spread across multiple physical memory devices. The software instructions may be read into main memory 330 from another computer-readable medium, such as storage device 350, or from another device via communication interface 380. The software instructions contained in main memory 330 may cause processing unit 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of device 300, in other implementations, device 300 may include fewer components, different components, differently arranged components, and/or additional components than depicted in FIG. 3. Alternatively, or additionally, one or more components of device 300 may perform one or more other tasks described as being performed by one or more other components of device 300.

Example Technical Computing Environment

Figure 4:
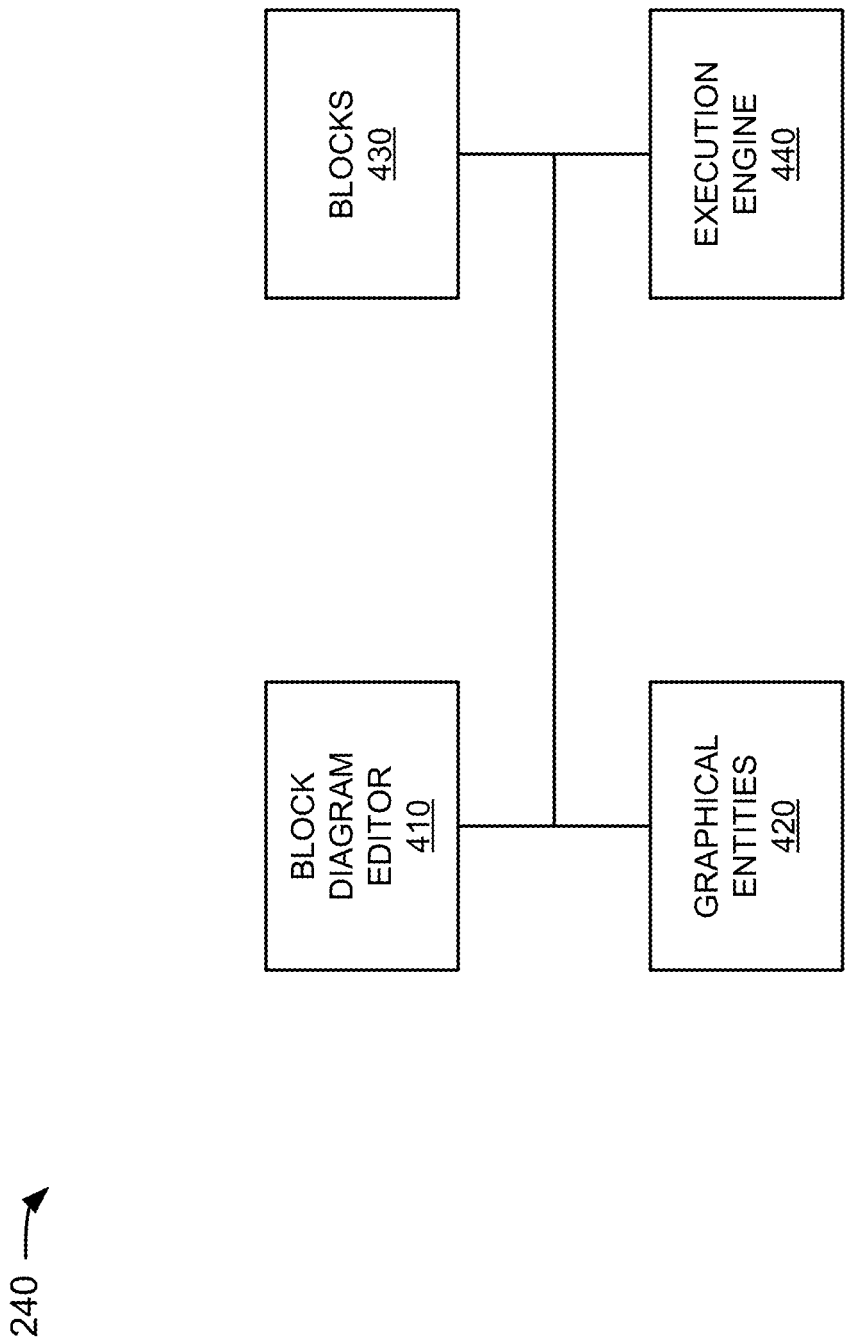
FIG. 4 is a diagram of example functional components of a technical computing environment (TCE) that may be used by one or more of the devices of the environment depicted in FIG. 2.

FIG. 4 is a diagram of example functional components of TCE 240. In one implementation, the functions described in connection with FIG. 4 may be performed by one or more components of device 300 (FIG. 3) and/or by one or more devices 300. As shown in FIG. 4, TCE 240 may include a block diagram editor 410, graphical entities 420, blocks 430, and/or an execution engine 440.

Block diagram editor 410 may include hardware or a combination of hardware and software that may be used to graphically specify models of dynamic systems. In one implementation, block diagram editor 410 may permit a user to perform actions, such as construct, edit, display, annotate, save, and/or print a graphical model (e.g., a block diagram that visually and/or pictorially represents a dynamic system). In another implementation, block diagram editor 410 may permit a user to create and/or store data relating to graphical entities 420.

A textual interface may be provided to permit interaction with block diagram editor 410. A user may write scripts that perform automatic editing operations on a model using the textual interface. For example, the textual interface may provide a set of windows that may act as a canvas for the model, and may permit user interaction with the model. A model may include one or more windows depending on whether the model is partitioned into multiple hierarchical levels.

Graphical entities 420 may include hardware or a combination of hardware and software that may provide entities (e.g., signal lines, buses, etc.) that represent how data may be communicated between functional and/or non-functional units and blocks 430 of a model. Blocks 430 may include fundamental mathematical elements of a block diagram model.

Execution engine 440 may include hardware or a combination of hardware and software that may process a graphical model to produce simulation results, may convert the graphical model into executable code, and/or may perform other analyses and/or related tasks. In one implementation, for a block diagram graphical model, execution engine 440 may translate the block diagram into executable entities (e.g., units of execution) following the layout of the block diagram. The executable entities may be compiled and/or executed on a device (e.g., client device 210) to implement the functionality specified by the model.

Graphical models may include entities with relationships between the entities, and the relationships and/or the entities may have attributes associated with them. The entities may include model elements such as blocks 430 and ports. The relationships may include model elements such as lines (e.g., connector lines) and references. The attributes may include model elements such as value information and meta information for the model element associated with the attributes. Graphical models may be associated with configuration information. The configuration information may include information for the graphical model such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks (e.g., blocks 430) connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks (e.g., blocks 430). A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks (e.g., blocks 430) may be causal and/or non-causal. For example, a model may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

A sample time may be associated with the elements of a graphical model. For example, a graphical model may include a block (e.g., block 430) with a continuous sample time such as a continuous-time integration block that may integrate an input value as time of execution progresses. This integration may be specified by a differential equation. During execution the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Alternatively, or additionally, a graphical model may include a block (e.g., block 430) with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model may include a block (e.g., block 430) with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated at this point in time and before advancing execution time.

Further, the values of attributes of a graphical model may be inferred from other elements of the graphical model or attributes of the graphical model. For example, the graphical model may include a block (e.g., block 430), such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks (e.g., blocks 430) where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model may be set to characteristics settings, such as one or more inherited settings, one or more default settings, etc. For example, the data type of a variable that is associated with a block (e.g., block 430) may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model (e.g., a fundamental execution period).

Although FIG. 4 shows example functional components of TCE 240, in other implementations, TCE 240 may include fewer functional components, different functional components, differently arranged functional components, and/or additional functional components than depicted in FIG. 4. Alternatively, or additionally, one or more functional components of TCE 240 may perform one or more other tasks described as being performed by one or more other functional components of TCE 240.

Example Technical Computing Environment Operations

Figure 5:
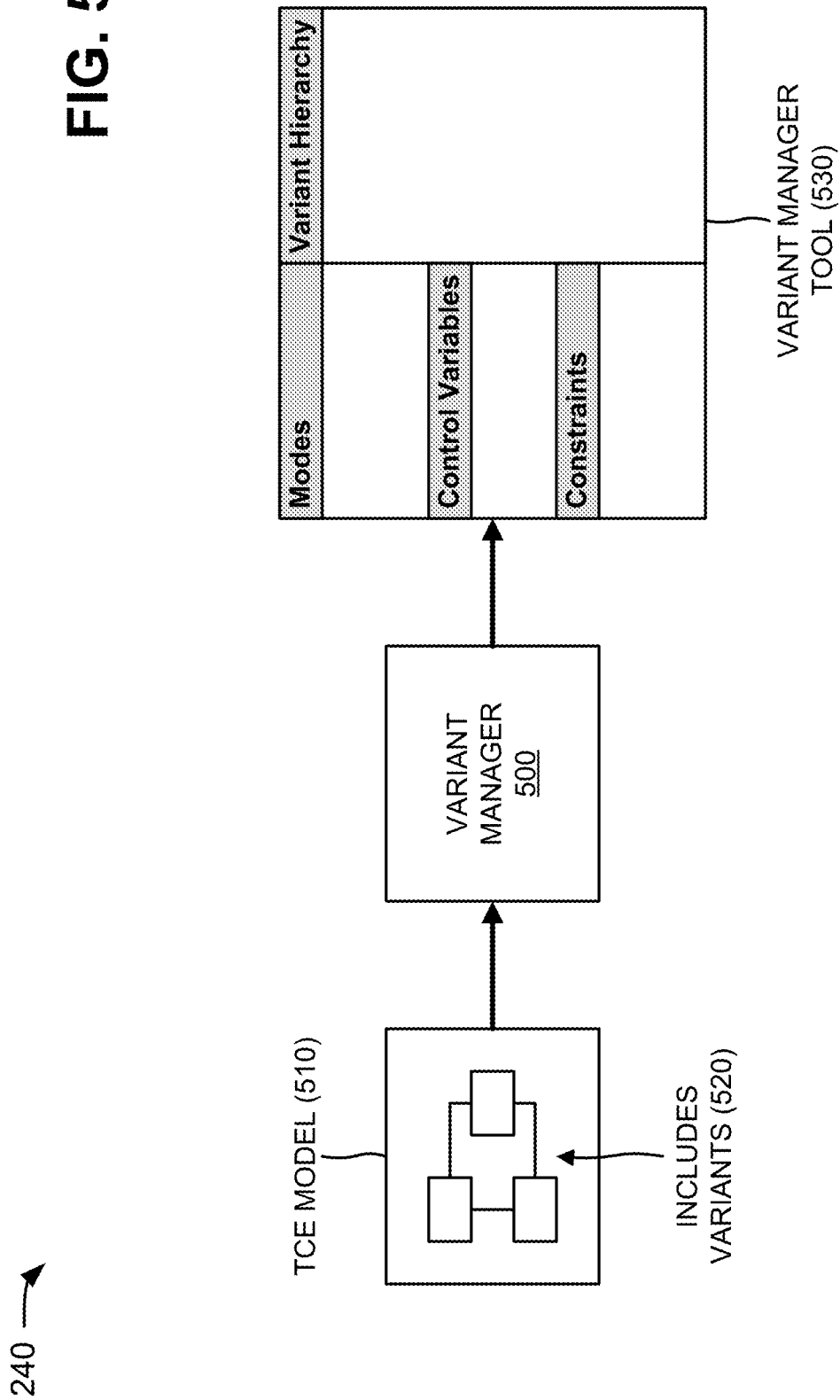
FIG. 5 is a diagram of example operations capable of being performed by the TCE.

FIG. 5 is a diagram of example operations capable of being performed by TCE 240. TCE 240 may include the features described above in connection with, for example, one or more of FIGS. 1-4. As illustrated in FIG. 5, TCE 240 may include a variant manager component 500. The functions described in connection with variant manager component 500 may be performed by one or more components of device 300 (FIG. 3) and/or by one or more devices 300.

As further shown in FIG. 5, variant manager component 500 may receive a model 510 generated by TCE 240. TCE model 510 may include a block diagram model with one or more model elements (e.g., blocks), one or more inputs, and one or more outputs. Each of the model elements may include a representation (e.g., a block) of a hardware device, a system, a subsystem, etc. of a system being modeled by TCE 240. In one example, TCE model 510 may include multiple variants 520 that enable an individual portion of TCE model 510 to have multiple implementations that may be swapped in and out by a user of TCE 240.

In one example implementation, variant manager component 500 may determine a hierarchy of variants 520 included in TCE model 510, and may receive or determine modes for variants 520 included in TCE model 510. The hierarchy of variants 520 may include a listing of variants 520 provided in an order according to a hierarchy of elements of TCE model 510 with which variants 520 are associated. A mode of a variant 520 may include a subset of a number of variant permutations. The modes for variants 520 may simplify creation of large-scale models by defining a finite set in which TCE model 510 may operate. Each mode may include values of all control variables used by variants 520 in TCE model 510. A user of TCE 240 may create a new mode and may select variants 520 to be active within the new mode. The modes for variants 520 may permit explicit overriding of particular variants 520 so that other variants 520 may be activated. Each mode may also be associated with a set of variant constraints.

Variant manager component 500 may receive or determine control variables for variants 520, and may receive or determine constraints for variants 520. The control variables may include variables used to control which variants 520 are active in TCE model 510. The constraints may ensure that conflicting variant 520 conditions are identified and prevented (e.g., a U.S. emissions system cannot be combined with a drive train for a California car since U.S. emissions standards do not meet California emissions standards). Variant manager component 500 may generate a variant manager tool 530 based on the hierarchy of variants 520, the modes for variants 520, the control variables for variants 520, and/or the constraints for variants 520. In one example, variant manager tool 530 may be hierarchical and may be associated with one or more TCE models 510.

Variant manager component 500 may output (e.g., display) and/or store variant manager tool 530. In one example, as shown in FIG. 5, variant manager tool 530 may include a variant hierarchy section (e.g., a window) for displaying the hierarchy of variants 520, and a modes section for displaying the modes for variants 520. The hierarchy of variants 520 may be displayed and navigable via a tree view, a two-dimensional graph, a three-dimensional graph, etc. Alternatively, or additionally, variant manager tool 530 may include a control variables section that displays the control variables for variants 520, and a constraints section that displays the constraints for variants 520. Further details of variant manager tool 530 are provided below in connection with, for example, one or more of FIGS. 7-18.

Although FIG. 5 shows example operations capable of being performed by TCE 240, in other implementations, TCE 240 may perform fewer operations, different operations, and/or additional operations than depicted in FIG. 5. Alternatively, or additionally, one or more components of FIG. 5 may perform one or more other tasks described as being performed by one or more other components of FIG. 5.

Example Variant Manager Component Operations

Figure 6:
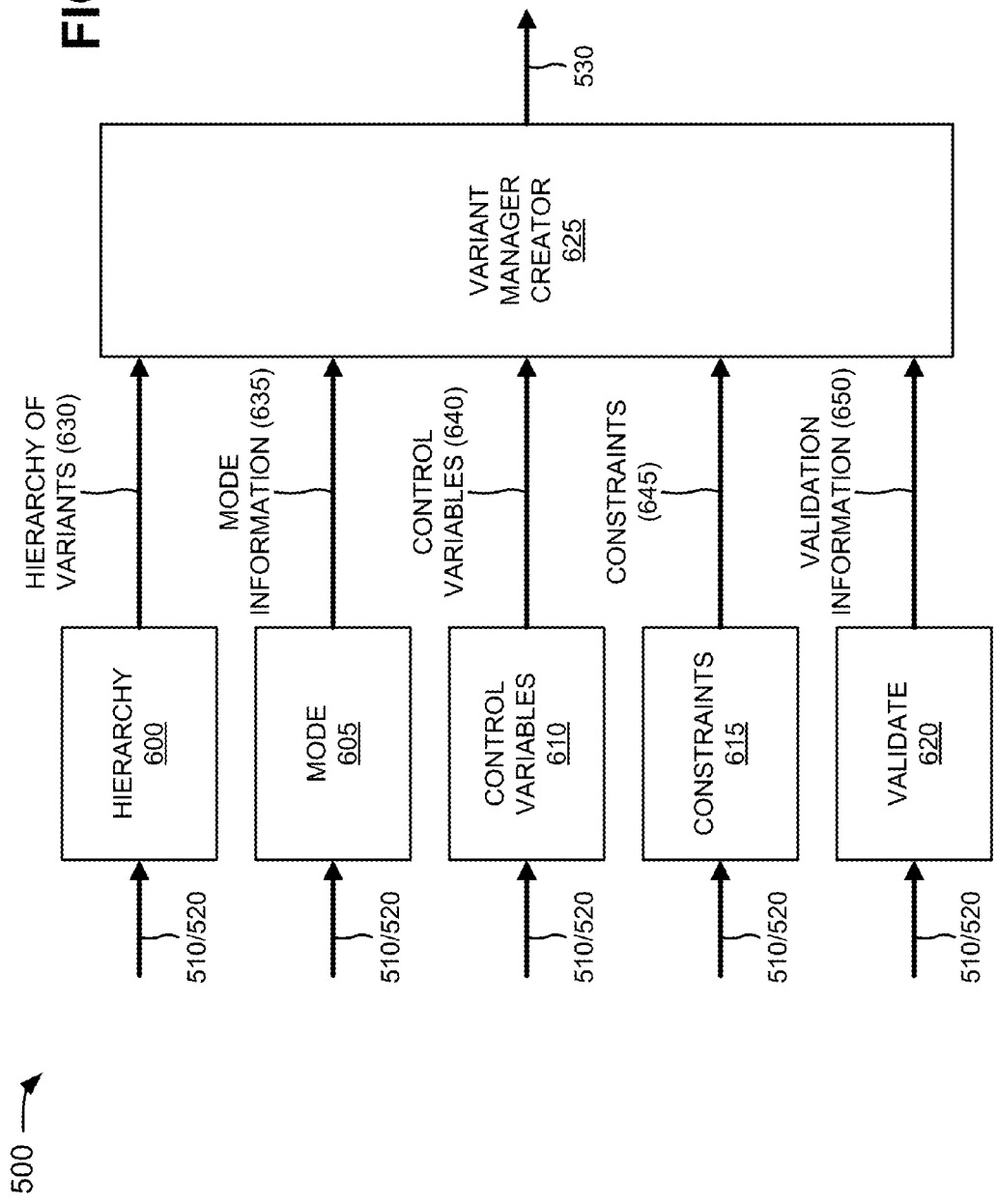
FIG. 6 is a diagram of example functional components of a variant manager component of the TCE.

FIG. 6 is a diagram of example functional components of variant manager component 500 (FIG. 5). The functions described in connection with variant manager component 500 may be performed by one or more components of device 300 (FIG. 3) and/or by one or more devices 300. As shown in FIG. 6, variant manager component 500 may include a hierarchy component 600, a mode component 605, a control variables component 610, a constraints component 615, a validate component 620, and a variant manager creator component 625.

Hierarchy component 600 may receive TCE code 510 and variants 520, and may determine a hierarchy 630 for variants 520. Hierarchy 630 may include a listing of variants 520 provided in an order according to the hierarchy of elements of TCE model 510 with which variants 520 are associated. For example, hierarchy component 600 may examine a block hierarchy of TCE model 510, may determine which blocks are associated with variants 520, and may determine hierarchy 630 based on the block hierarchy of TCE model 510 and the determined blocks. As further shown in FIG. 6, hierarchy component 600 may provide hierarchy 630 to variant manager creator component 625.

Mode component 605 may receive TCE code 510 and variants 520, and may determine mode information 635 for variants 520. Mode information 635 may include information describing a subset of a number of variant permutations (e.g., a number of different options associated with a variant), information defining a finite set in which TCE model 510 may operate, values of all control variables used by variants 520 in TCE model 510, etc. As further shown in FIG. 6, mode component 605 may provide mode information 635 to variant manager creator component 625.

Control variables component 610 may receive TCE code 510 and variants 520, and may determine control variables 640 for variants 520. Control variables 640 may include variables used to control which variants 520 are active in TCE model 510. As further shown in FIG. 6, control variables component 610 may provide control variables 640 to variant manager creator component 625.

Constraints component 615 may receive TCE code 510 and variants 520, and may determine constraints 645 for variants 520. Constraints 645 may include information that ensures that conflicting variant 520 conditions are identified and prevented. For example, if TCE model 510 relates to a vehicle manufacturing facility, constraints 645 may prevent an engine for a truck from being provided in an automobile. As further shown in FIG. 6, constraints component 615 may provide constraints 645 to variant manager creator component 625.

Validate component 620 may receive TCE code 510 and variants 520, and may determine validation information 650 for variants 520. In one example, validate component 620 may receive (e.g., from a user of TCE 240) a request to validate variants 520 in TCE model 510, and may determine whether there are any variant violation(s) based on the request. A variant violation may occur when constraints 645 are violated by variants 520, when control variables 640 set incorrect variants 520 to an active state, etc. Validate component 620 may display any variant violation(s) (e.g., validation information 650) to the user of TCE 240. As further shown in FIG. 6, validate component 620 may provide validation information 650 to variant manager creator component 625.

Variant manager creator component 625 may receive hierarchy 630 of variants 520, mode information 635, control variables 640, constraints 645, and validation information 650. Variant manager creator component 625 may generate variant manager tool 530 based on hierarchy 630 of variants 520, mode information 635, control variables 640, constraints 645, and/or validation information 650. Variant manager creator component 625 may output (e.g., display) and/or store variant manager tool 530.

Although FIG. 6 shows example functional components of variant manager component 500, in other implementations, variant manager component 500 may include fewer functional components, different functional components, differently arranged functional components, and/or additional functional components than depicted in FIG. 6. Alternatively, or additionally, one or more functional components of variant manager component 500 may perform one or more tasks described as being performed by one or more other functional components of variant manager component 500.

Example TCE Model/Variant Manager Tool User Interfaces

FIGS. 7-18 are diagrams of example user interfaces 700-1800 capable of being generated by variant manager component 500 and/or TCE model 510 (FIGS. 5 and 6). In one example, user interfaces 700-1800 may correspond to information associated with TCE model 510 and/or variant manager tool 530 (FIGS. 5 and 6). User interfaces 700-1800 may include graphical user interfaces (GUIs) or non-graphical user interfaces, such as text-based interfaces. User interfaces 700-1800 may provide information to users via customized interfaces (e.g., proprietary interfaces) and/or other types of interfaces (e.g., browser-based interfaces, etc.). User interfaces 700-1800 may receive user inputs via one or more input devices, may be user-configurable (e.g., a user may change the sizes of user interfaces 700-1800, information displayed in user interfaces 700-1800, color schemes used by user interfaces 700-1800, positions of text, images, icons, windows, etc., in user interfaces 700-1800, etc.), and/or may not be user-configurable. Information associated with user interfaces 700-1800 may be selected and/or manipulated by a user of client device 210 and/or server device 220 (e.g., via a touch screen display, a mouse, a keyboard, a keypad, voice commands, etc.).

Figure 7:
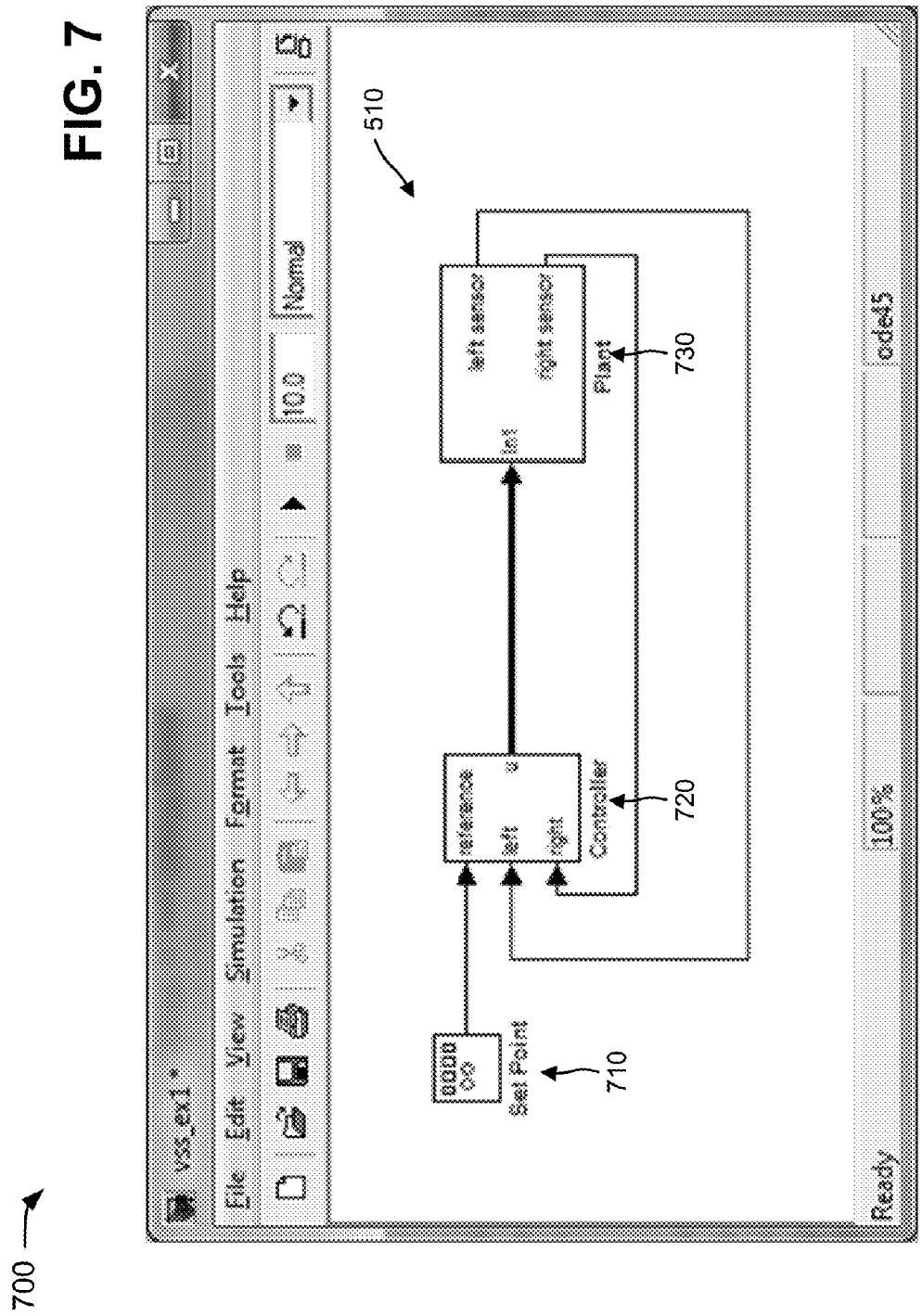

As shown in FIG. 7, user interface 700 may include a variety of information associated with TCE model 510. For example, user interface 700 may include a model with variant subsystems and variant model blocks. For example, TCE model 510 may include a set point block 710, a controller block 720, and a plant block 730.

Set point block 710 may include a block that generates a reference signal and provides the reference signal to controller block 720. Controller block 720 may include a subsystem block that receives the reference signal from set point block 710, and receives left and right signals from plant block 730. Controller block 720 may control plant block 730 based on the received signals. Plant block 730 may include a block that includes a left sensor for generating the left signal and a right sensor for generating the right signal.

Although user interface 700 depicts a variety of information, in other implementations, user interface 700 may depict less information, different information, differently arranged information, and/or additional information than depicted in FIG. 7.

Figure 8:
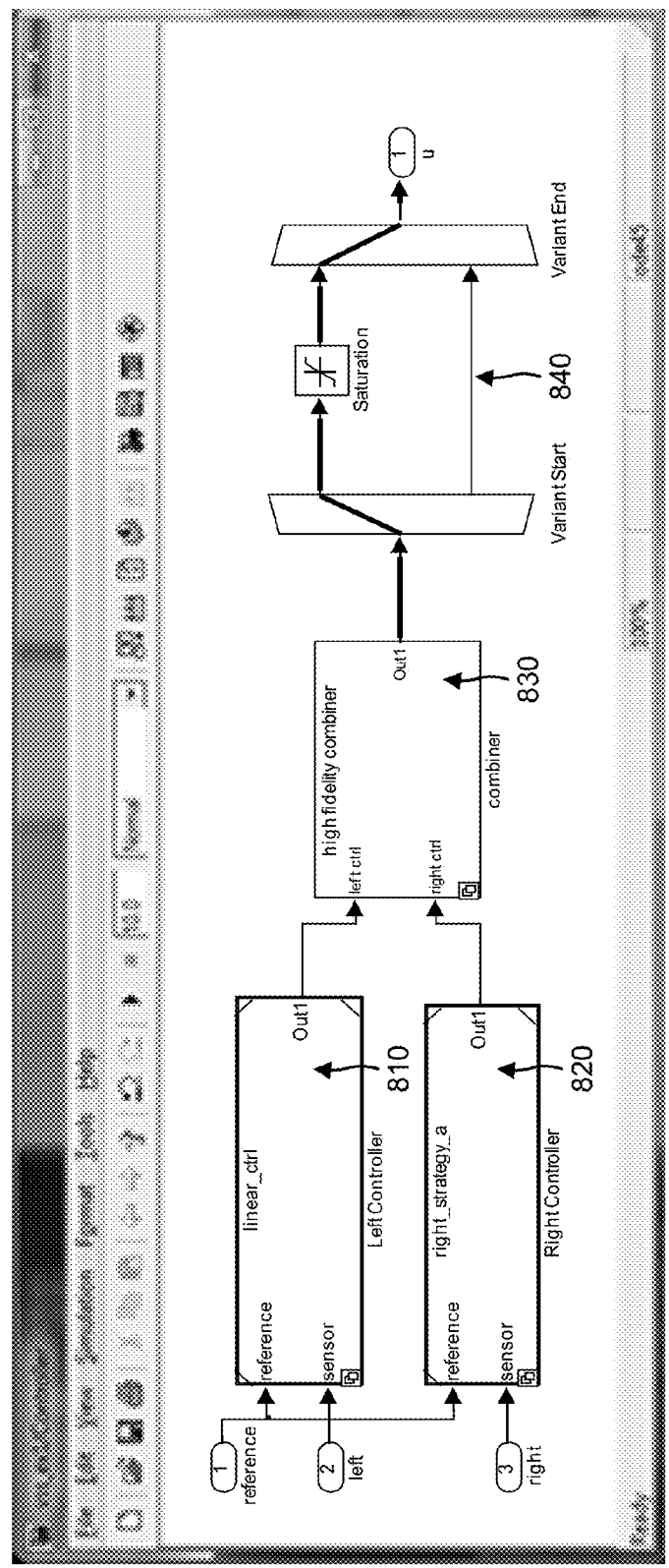

If a user of TCE model 510 selects controller block 720, user interface 800 (FIG. 8) may be displayed to the user. As shown in FIG. 8, user interface 800 may include a variety of information associated with controller block 720. For example, controller block 720 may include a left controller model block 810, a right controller model block 820, a combiner block 830, and other blocks 840. Controller block 720 may be considered a subsystem block since it includes a dynamic system created from other blocks.

Left controller model block 810 may reference another model, where the referenced model may provide implementations for the block. Furthermore, block 810 may include variant information that enables a user to programmatically control which model is referenced. The variant information may be set up as described below in connection with FIG. 9. Right controller model block 820 may include variant information. Combiner block 830 may include a variant subsystem block that includes the features described below in connection with FIG. 10. Other blocks 840 may include other blocks associated with controller block 720, such as, for example, a variant start block, a saturation block, a variant end block, etc.

Although user interface 800 depicts a variety of information, in other implementations, user interface 800 may depict less information, different information, differently arranged information, and/or additional information than depicted in FIG. 8.

Figure 9:
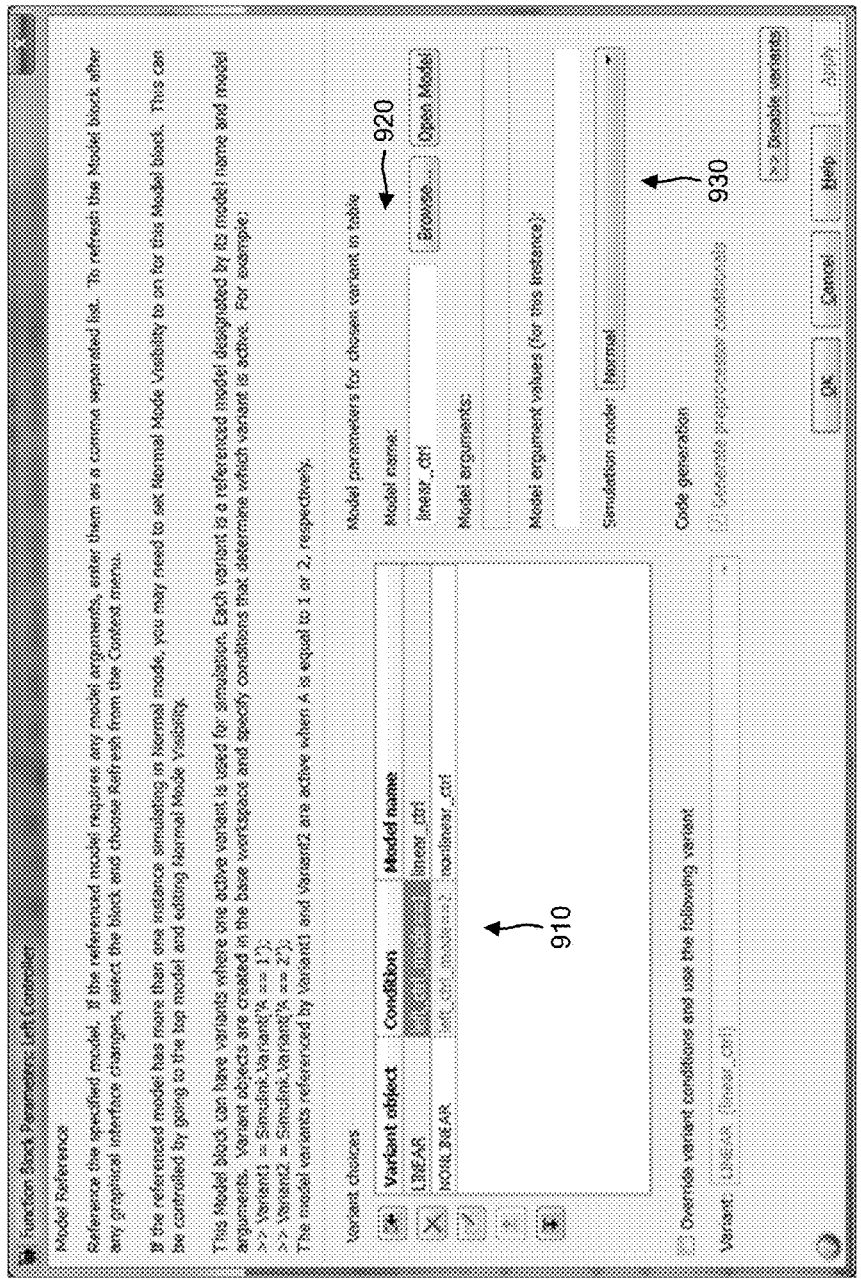

A user of TCE model 510 may set up left controller model block 810 (FIG. 8) with user interface 900 (FIG. 9). In one example, a user may access user interface 900 by selecting a menu option, by right clicking left controller model block 810 and selecting an option, etc. As shown in FIG. 9, user interface 900 may include a variety of information associated with left controller model block 810. For example, user interface 900 may include a section 910 to select variant choices for left controller model block 810, a section 920 to specify model parameters for selected variants, and a section 930 to specify a simulation mode for left controller model block 810.

Section 910 may enable left controller model block 810 to reference either a linear control model (e.g., linear_ctrl) or a nonlinear control model (e.g., nonlinear_ctrl). As shown in FIG. 9, left controller model block 810 may reference (e.g., use) the linear control model when a LINEAR variant is true (e.g., when left_ctrl_mode==1). Left controller model block 810 may reference the nonlinear control model when a NONLINEAR variant is true (e.g., when left_ctrl_mode==2). A variant may be programmatically selected by an expression (e.g., left_ctrl_mode==1). The expression may be a simple equality; a complex set of Boolean algebra (e.g., X && Y||left_ctrl_mode==1||speed==FAST, which is an expression of variants X and Y); scalars (e.g., left_ctrl_mode); enumeration types; and any general purpose expression (e.g., a condition) that results in a Boolean true or false.

Alternatively, or additionally, the expression may be identified by a name (e.g., LINEAR may be used to describe the left_ctrl_mode==1 expression) that may be an object. For example, variant objects may be created, such as LINEAR=Model.Variant('left_ctrl_mode==1'). Independent variables within the expression may be referred to as variant control variables because changing their values changes the active variant. For example setting the left control mode to one (e.g., left_ctrl_mode=1) may cause the LINEAR variant to be active. The variant choices in section 910 may enable a user to programmatically swap out different implementations, by, for example changing the value of a variable (e.g., left_ctrl_mode) that is external to TCE model 510.

Section 920 may enable a user to specify model parameters (e.g., a model name, model arguments, model argument values, etc.) for variants selected in section 910. Section 930 may enable a user to specify a simulation mode (e.g., normal, accelerated, etc.) for variants selected in section 910.

Although user interface 900 depicts a variety of information, in other implementations, user interface 900 may depict less information, different information, differently arranged information, and/or additional information than depicted in FIG. 9.

Figure 10:
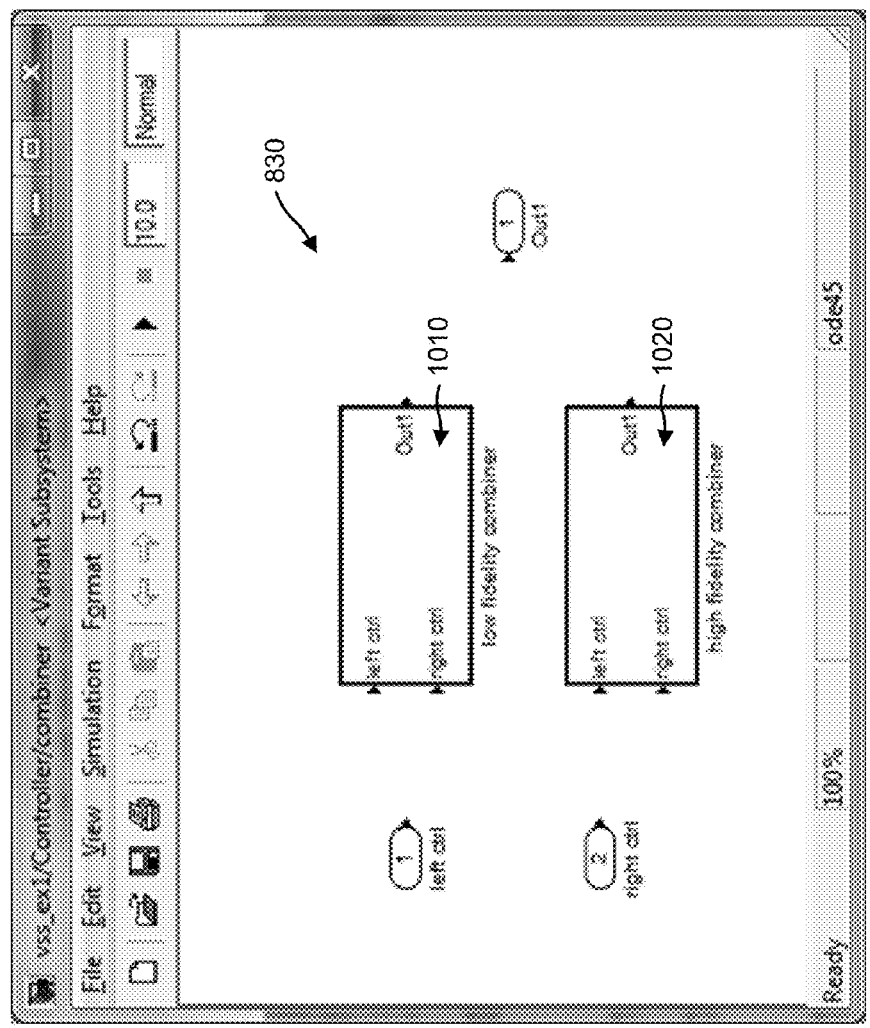

If a user of TCE model 510 selects combiner block 830 (FIG. 8), user interface 1000 (FIG. 10) may be displayed to the user. As shown in FIG. 10, user interface 1000 may include a variety of information associated with combiner block 830. For example, combiner block 830 may include a low fidelity combiner block 1010 and a high fidelity combiner block 1020.

Low fidelity combiner block 1010 may include an input for a left control signal, an input for a right control signal, and an output for an output signal. High fidelity combiner block 1020 may include an input for the left control signal, an input for the right control signal, and an output for the output signal. Low fidelity combiner block 1010 and high fidelity combiner block 1020 may include variant blocks that may be set up as described below in connection with FIG. 11.

Although user interface 1000 depicts a variety of information, in other implementations, user interface 1000 may depict less information, different information, differently arranged information, and/or additional information than depicted in FIG. 10.

Figure 11:
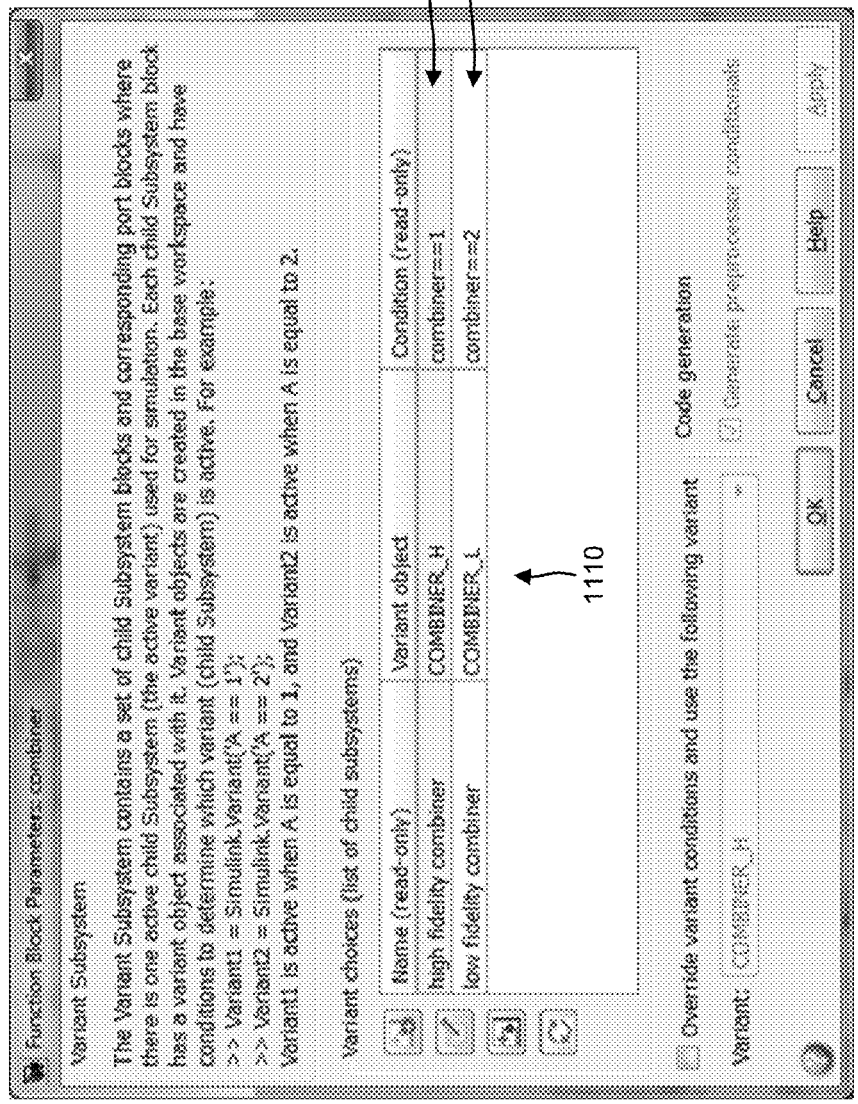

A user of TCE model 510 may set up low fidelity combiner block 1010 or high fidelity combiner block 1020 with user interface 1100 (FIG. 11). In one example, a user may access user interface 1100 by selecting a menu option, by right clicking low fidelity combiner block 1010 or high fidelity combiner block 1020 and selecting an option, etc. As shown in FIG. 11, user interface 1100 may include a variety of information associated with low fidelity combiner block 1010 or high fidelity combiner block 1020. For example, user interface 1100 may include a section 1110 to select variant choices for low fidelity combiner block 1010 or high fidelity combiner block 1020.

Section 1110 may enable a user to specify conditions under which combiner block 830 selects low fidelity combiner block 1010 or high fidelity combiner block 1020 to be active in TCE model 510. As shown in FIG. 11, combiner block 830 may select (e.g., make active) high fidelity combiner block 1020 when a variable (e.g., combiner) satisfies a condition (e.g., when combiner==1), as indicated by reference number 1120. Combiner block 830 may select (e.g., make active) low fidelity combiner block 1010 when the variable (e.g., combiner) satisfies another condition (e.g., when combiner==2), as indicated by reference number 1130. As shown in FIG. 10, input blocks (e.g., left and right control blocks) and an output block are not connected to low fidelity combiner block 1010 or high fidelity combiner block 1020. When combiner block 830 selects low fidelity combiner block 1010, TCE model 510 may programmatically connect low fidelity combiner block 1010 to the input blocks and the output block. When combiner block 830 selects high fidelity combiner block 1020, TCE model 510 may programmatically connect high fidelity combiner block 1020 to the input blocks and the output block.

Although user interface 1100 depicts a variety of information, in other implementations, user interface 1100 may depict less information, different information, differently arranged information, and/or additional information than depicted in FIG. 11.

Figure 12:
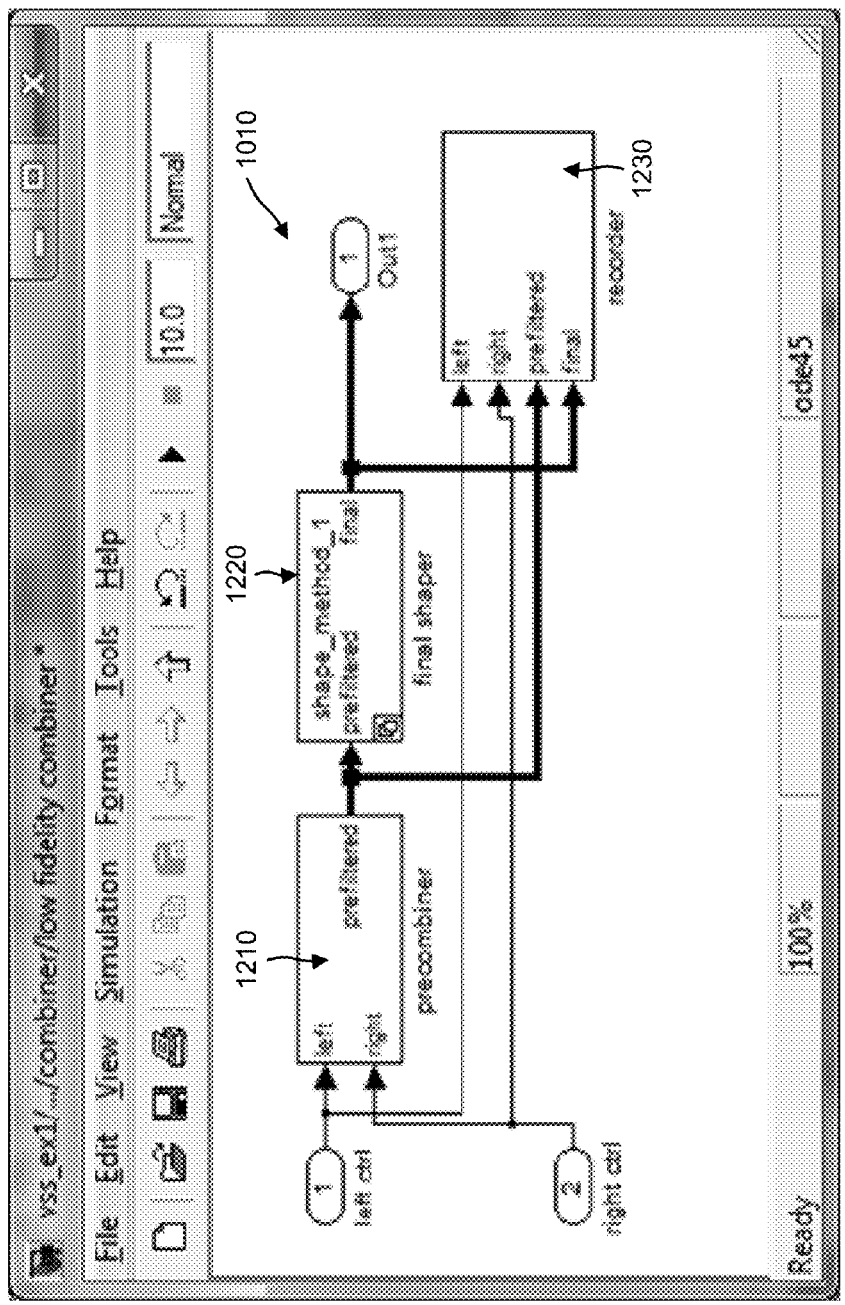

If a user of TCE model 510 selects low fidelity combiner block 1010 (FIG. 10), user interface 1200 (FIG. 12) may be displayed to the user. As shown in FIG. 12, user interface 1200 may include a variety of information associated with low fidelity combiner block 1010. For example, low fidelity combiner block 1010 may include a precombiner block 1210, a final shaper block 1220, and a recorder block 1230.

Precombiner block 1210 may include a subsystem block that receives a left control signal from a left control block, and receives a right control signal from a right control block. Precombiner block 1210 may apply transformations to the left and right control signals to ensure that the left and right control signals are ready to be shaped for a final control input. Precombiner block 1210 may bundle the left and right control signals into a vector signal (e.g., a prefiltered signal). The prefiltered signal of precombiner block 1210 may be passed to final shaper block 1220.

Final shaper block 1220 may produce a final control value signal based on the prefiltered signal. The final control value signal may be an output (e.g., Out1) signal of combiner block 830 (FIG. 8). The recorder block 1230 may receive the left and right control signals, the prefiltered signal, and the final control value signal, and may record the received signals.

The final control value signal may be provided to the variant start block (FIG. 8, associated with reference number 840). The variant start block and the variant end block (FIG. 8, associated with reference number 840) may graphically inline variant selections. In one example, a first variant may pass the final control value signal to the saturation block (FIG. 8, associated with reference number 840). A second variant may not perform an operation on the final control value signal. The active variant may be programmatically determined using a control variable. For example, the first variant may be active when the control variable is on (e.g., final_saturate=1), and the second variant may be active when the control variable is off (e.g., final_saturate=0).

Although user interface 1200 depicts a variety of information, in other implementations, user interface 1200 may depict less information, different information, differently arranged information, and/or additional information than depicted in FIG. 12.

Figure 13:
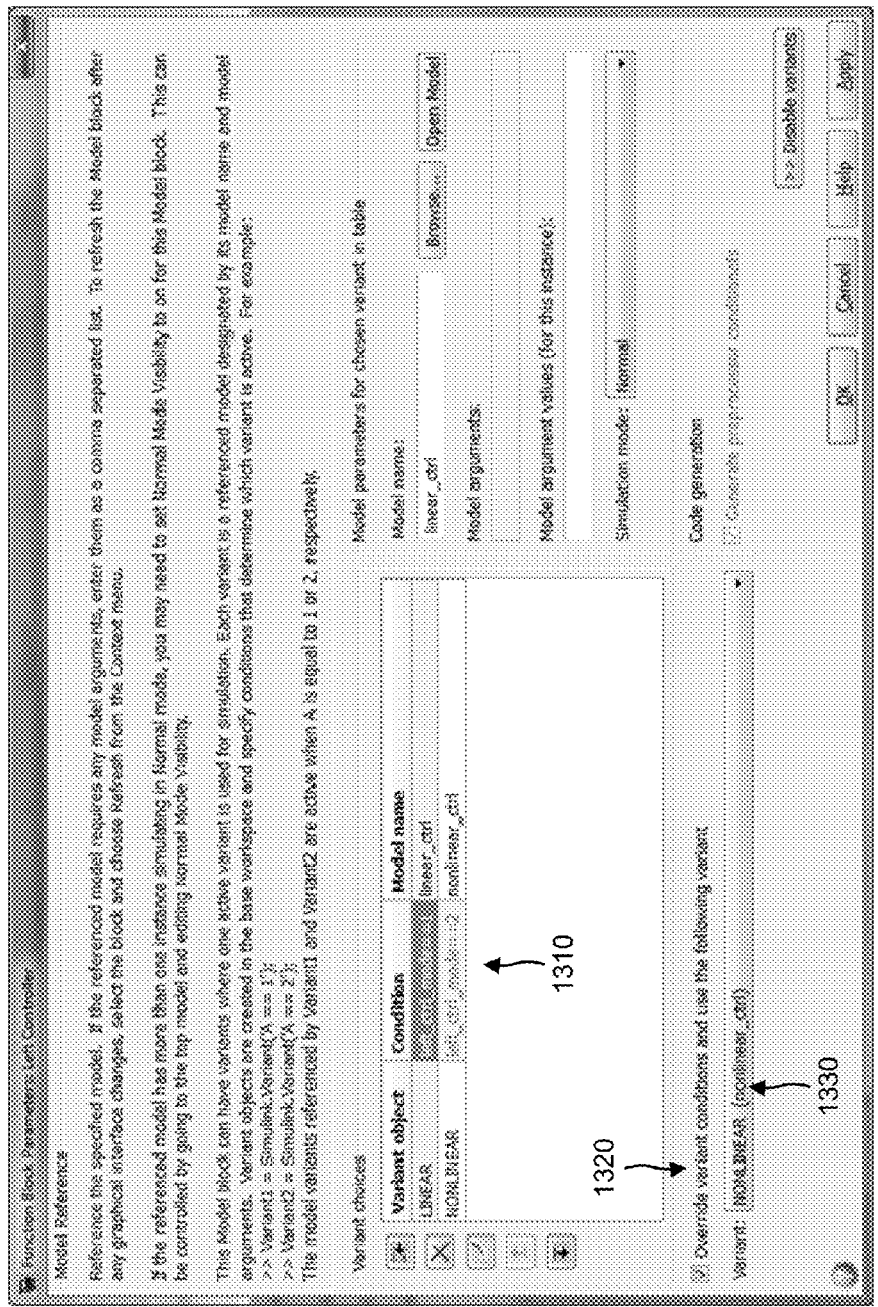

A user of TCE model 510 may further set up left controller model block 810 (FIG. 8) with user interface 1300 (FIG. 13). In one example, a user may access user interface 1300 by selecting a menu option, by right clicking left controller model block 810 and selecting an option, etc. As shown in FIG. 13, user interface 1300 may include a variety of information associated with left controller model block 810. For example, user interface 1300 may include a section 1310 to select variant choices for left controller model block 810.

Section 1310 may enable left controller model block 810 to reference either a linear control model (e.g., linear_ctrl) or a nonlinear control model (e.g., nonlinear ctrl). As shown in FIG. 13, left controller model block 810 may reference (e.g., use) the linear control model when a LINEAR variant is true (e.g., when left_ctrl_mode==1). Left controller model block 810 may reference the nonlinear control model when a NON-LINEAR variant is true (e.g., when left_ctrl_mode==2). In addition to programmatically controlling the active variants, the user may instruct TCE model 510 to ignore control variables and use a specified variant. For example, as shown in FIG. 13, the user may force the left controller model block 810 to use the nonlinear control model by selecting a checkbox 1320 (e.g., "Override variant conditions and use the following variant") and by selecting the NONLINEAR variant from a menu 1330 of variants.

Although user interface 1300 depicts a variety of information, in other implementations, user interface 1300 may depict less information, different information, differently arranged information, and/or additional information than depicted in FIG. 13.

User interfaces 700-1300 depict a simple example of a small TCE model 510 containing a few variants 520. However, in a graphical modeling environment, a user may create a large TCE model 510 that includes thousands of blocks containing thousands of different variants 520. Managing a large number of variants 520 may be cumbersome for the user. When a TCE model 510 includes thousands or even hundreds of different variants 520, a number of permutations of active variant configurations may be extremely high. Furthermore, some of the different permutations may be invalid. Invalid variant configurations may occur when constraints exist between variants 520 and the constraints are violated. Another variant configuration management problem may include ensuring that a user knows when variants 520 are in the "override" mode, as described above in connection with FIG. 13.

The example TCE model 510 (e.g., vss_ex1) depicted in FIGS. 7-13 may include the following block hierarchy:

---
vss_ex1 (Model)
  - Controller (Subsystem)
    reference (Inport 1)
    left (Inport 2)
    right (Inport 3)
    - Left Controller (Variant Model block)
      - linear_ctrl (Model)
        reference (Inport 1)
        - Discrete Filter (Variant Subsystem)
          + Second order filter (Subsystem)
          + High-order filter (Subsystem)
        sensor (Inport 2)
        Out1 (Outport 1)
      + nonlinear_ctrl (Model)
    + Right Controller (Variant Model block)
    - combiner (Variant Subsystem)
      left ctrl (Inport 1)
      right ctrl (Inport 2)
      + high fidelity combiner (Subsystem)
      - low fidelity combiner (Subsystem)
        left ctrl (Inport 1)
        right ctrl (Inport 2)
        + precombiner
        - final shaper
          prefiltered (Inport)
          + shape_method_1
          + shape_method_2
          final (Outport 1)
        + recorder (subsystem)
        Out1 (Outport 1)
      Out1 (Outport 2)
    Variant Start (Variant Start)
    Saturation (Saturation)
    Variant End (Variant End)
    u (Outport 1)
  + Plant (Subsystem)
  Set Point (Signal Generator).

---

The block hierarchy may include a block name (e.g., Controller) and block type in parenthesis (e.g., Subsystem). A symbol (e.g., '−') may indicate that a hierarchical node (e.g., a model block or a subsystem block) is expanded, and another symbol (e.g., '+') may indicate that a hierarchical node is collapsed.

The example TCE model 510 (e.g., vss_ex1) may include several different variant configurations. For example, one variant configuration may include the following block hierarchy (e.g., where the active variants are marked as [active]):

---
vss_ex1 (Model)
  - Controller (Subsystem)
    reference (Inport 1)
    left (Inport 2)
    right (Inport 3)
    - Left Controller (Variant Model block)
      - [active] linear_ctrl (Model)
        reference (Inport 1)
        - Discrete Filter (Variant Subsystem)
          + [active] Second order filter (Subsystem)
          + High-order filter (Subsystem)
        sensor (Inport 2)
        Out1 (Outport 1)
      + nonlinear_ctrl (Model)
    + Right Controller (Variant Model block)
    - combiner (Variant Subsystem)
      left ctrl (Inport 1)
      right ctrl (Inport 2)
      + high fidelity combiner (Subsystem)
      - [active] low fidelity combiner (Subsystem)
        left ctrl (Inport 1)
        right ctrl (Inport 2)
        + precombiner (Subsystem)
        - final shaper (Variant Subsystem)
          prefiltered (Inport)
          + [active] shape_method_1
          + shape_method_2
          final (Outport 1)
        + recorder (subsystem)
        Out1 (Outport 1)
      Out1 (Outport 2)
    [first variant active]Variant Start (Variant Start)
    Saturation (Saturation)
    Variant End (Variant End)
    u (Outport 1)
  + Plant (Subsystem)
  Set Point (Signal Generator).

---

Alternatively, or additionally, a variant configuration may include an activated high-order filter instead of an activated second order filter. The example TCE model 510 may include many different variant configurations and not all of the variant configurations may be valid. For example, the example TCE model 510 may require that a first variant of a variant start block be active when a low fidelity combiner block is active because a signal may need to be saturated. However, the example TCE model 510 may be missing this variant management information.

Variant manager tool 530 (FIG. 5) may address the aforementioned difficulties associated with variant management, especially for large models containing thousands of hierarchical blocks. Variant manager tool 530 may enable a user to visualize a hierarchal nature of TCE model 510, as well as a variant structure of TCE model 510, and to create a predefined set of modes for TCE model 510. Each mode, of the set of modes, may configure active variants 520. Variant manager tool 530 may enable a user to define constraints between variants 520, and to control variant overriding. Variant manager tool 530 may also validate the variant structure of TCE model 510.

As shown in FIG. 14, user interface 1400 may include a variety of information associated with variant manager tool 530. For example, user interface 1400 may include a modes section 1410, a control variables section 1420, a constraints section 1430, and a variant hierarchy section 1440.

Modes section 1410 may include information enabling a user to create modes, delete modes, copy modes, set a default mode, etc. Modes section 1410 may include information describing a selected mode (e.g., a description of mode2). A mode that is currently selected (e.g., mode2) may be considered an active mode.

For an active mode selected in modes section 1410, control variables section 1420 may provide control variables (e.g., a combiner, a left_ctrl_mode, a right_strategy, a shape_method, a final_saturate, etc.) and their values. A user may select one of the control variables to set properties for the selected control variable. Selection of the control variable may cause variant manager tool 530 to display a dialog that may be used to configure the selected control variable for code generation.

For each mode in modes section 1410, a user may utilize constraints section 1430 to optionally define constraints (e.g., for a mode and that apply across variants) that must be satisfied. Each mode may include a set of variant control variables that configure the variants and optionally a set of constraints. If a constraint is satisfied by a variant, the variant may pass the constraint. If a constraint is not satisfied by a mode, the mode may violate the constraint and produce an error. As shown in FIG. 14, an active mode (e.g., mode2) may include the following constraint:

if (COMBINER_L && !FINAL_SATURATE_ON)
  error('final saturate must be on when using low fidelity combiner')
end.

This constraint may produce an error message when a user attempts to configure TCE model 510 with low fidelity combiner block 1010 (FIG. 10) active and the saturation block (FIG. 8) inactive. Alternatively, or additionally, the same constraint may be specified by an expression, such as, for example, !COMBINER_L||(COMBINER_L && !FINAL_SATURATE_ON).

Variant hierarchy section 1440 may provide a hierarchy of TCE model 510 with variant information. In one example, variant hierarchy section 1440 may display a textual tree view of the hierarchy of TCE model 510, with the variant information. Alternatively, or additionally, variant hierarchy section 1440 may display the hierarchy of TCE model 510 in other configurations, such as the configurations described below in connection with FIGS. 15, 17, and 18.

As further shown in FIG. 14, user interface 1400 may include a validate button 1450 (or other types of selection mechanisms) that, when selected, may cause variant manager tool 530 to evaluate variants 520 and display results of the evaluation (e.g., variant violation error messages). User interface 1400 may include other buttons 1460 (or other types of selection mechanisms) that enable a user to manipulate information provided in user interface 1400, retrieve help information, etc.

Although user interface 1400 depicts a variety of information, in other implementations, user interface 1400 may depict less information, different information, differently arranged information, and/or additional information than depicted in FIG. 14.

As shown in FIG. 15, user interface 1500 may include a variety of information associated with variant manager tool 530. For example, user interface 1500 may include modes section 1410, control variables section 1420, constraints section 1430, and variant hierarchy section 1440. Modes section 1410, control variables section 1420, constraints section 1430, and variant hierarchy section 1440 may include the features described above in connection with, for example, FIG. 14.

As further shown in FIG. 15, variant hierarchy section 1440 may provide a textual hierarchy of variants 520 (e.g., rather than a hierarchy of TCE model 510), as indicated by reference number 1510. When viewing the hierarchy of variants 520, blocks of TCE model 510 that do not include variants 520 may not be illustrated. For example, blocks for inputs, outputs, regular subsystems, etc. may not be shown in variant hierarchy section 1440. Variant hierarchy section 1440 may include other information such as a block type (e.g., the controller block may be displayed as "—Controller (Subsystem)").

Although user interface 1500 depicts a variety of information, in other implementations, user interface 1500 may depict less information, different information, differently arranged information, and/or additional information than depicted in FIG. 15.

Figure 16:
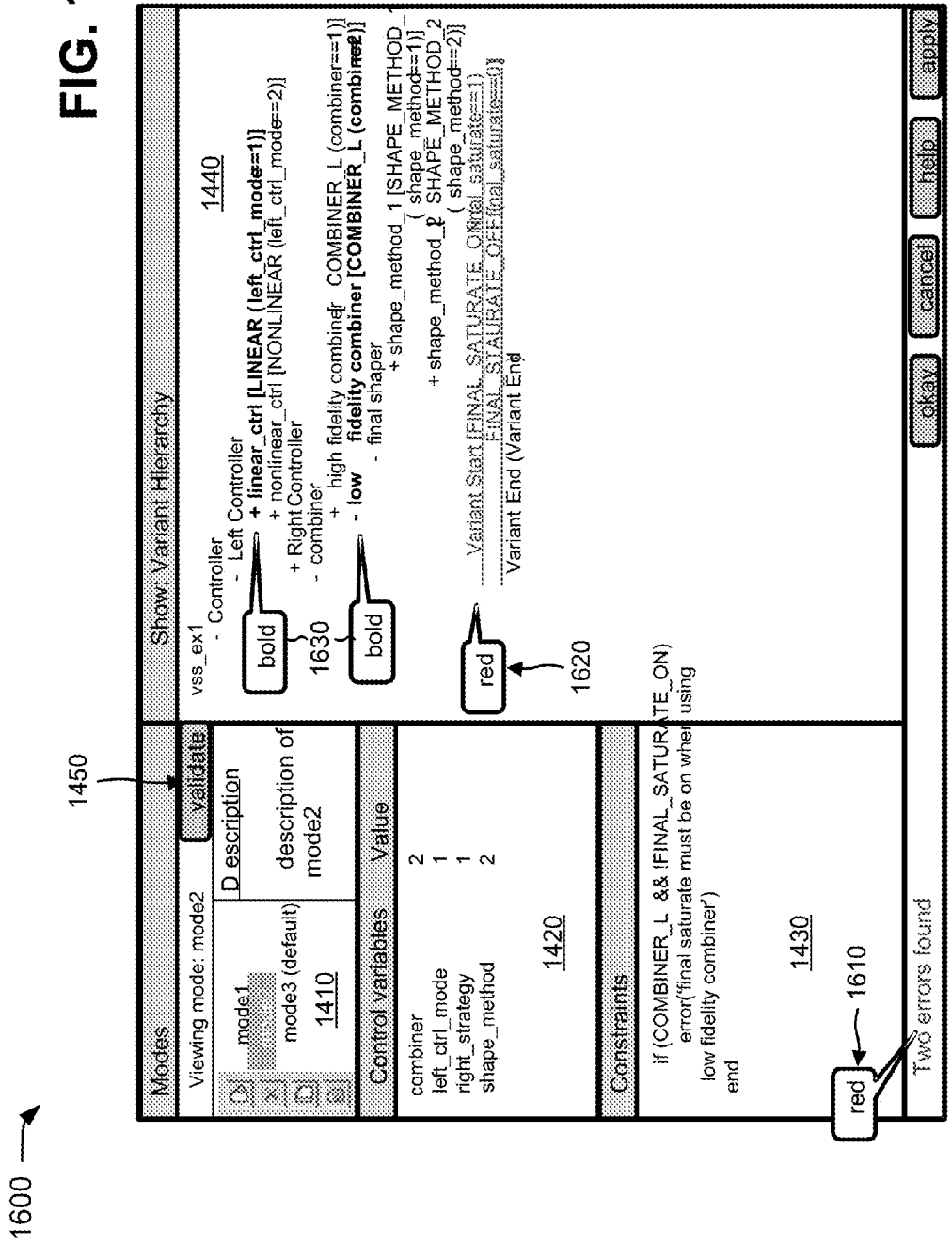

As shown in FIG. 16, user interface 1600 may include a variety of information associated with variant manager tool 530. For example, user interface 1600 may include modes section 1410, control variables section 1420, constraints section 1430, and variant hierarchy section 1440. Modes section 1410, control variables section 1420, constraints section 1430, and variant hierarchy section 1440 may include the features described above in connection with, for example, one or more of FIGS. 14 and 15.

As further shown in FIG. 16, when a user selects validate button 1450, variant manager tool 530 may evaluate variants 520 for violations, and may display results of the evaluation (e.g., variant violation error messages). Alternatively, or additionally, variant manager tool 530 may automatically perform variant validation as variant information is being edited by a user. For example, if, during editing, variant information cannot be evaluated due to syntax errors, variant manager tool 530 may provide a message 1610 (e.g., indicating syntax errors) in a status window and may underline and/or alter the color of the syntax errors, as indicated by reference number 1620. As shown in FIG. 16, the status window may indicate that two errors have been found, and variant hierarchy section 1440 may indicate (e.g., in red and underline) that conditions for the variant start block/variant end block pair cannot be evaluated because a final saturate is not defined. Because the final saturate is not defined, the constraints may fail to evaluate the block pair, and variant manager tool 530 may produce a message indicating that the final saturate variable is not defined.

Alternatively, or additionally, variants 520 that are in an override mode may be annotated, such as with italicized text, colored text, strike-though, etc. If a variant control has been overridden, variant manager tool 530 may display information indicating that the override is in effect and may report such information when validating variants 520. This may occur because an override is generally an exceptional condition. Alternatively, or additionally, active variants 520 may be emphasized, such as, for example with bolded text, as indicated by reference number 1630.

Although user interface 1600 depicts a variety of information, in other implementations, user interface 1600 may depict less information, different information, differently arranged information, and/or additional information than depicted in FIG. 16.

Figure 17:
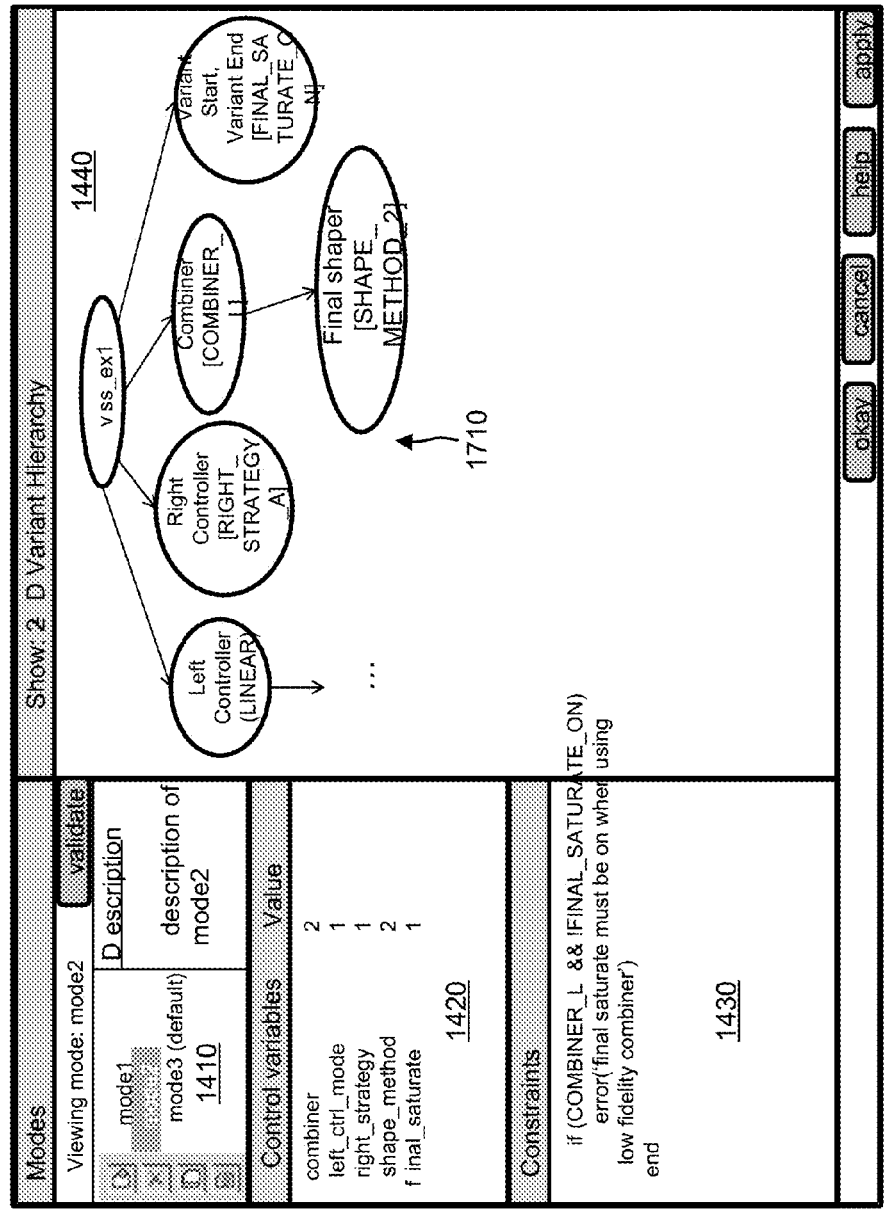

As shown in FIG. 17, user interface 1700 may include a variety of information associated with variant manager tool 530. For example, user interface 1700 may include modes section 1410, control variables section 1420, constraints section 1430, and variant hierarchy section 1440. Modes section 1410, control variables section 1420, constraints section 1430, and variant hierarchy section 1440 may include the features described above in connection with, for example, one or more of FIGS. 14-16.

As further shown in FIG. 17, variant hierarchy section 1440 may provide a two-dimensional graphical view of the hierarchy of variants 520 (e.g., rather than a textual view of the hierarchy of variants 520), as indicated by reference number 1710. In this view, a two-dimensional graph may display only the hierarchy of variants 520. Non-displayed blocks of TCE model 510 may be collapsed and shown with a designation (e.g., " . . . "). Desired aspects of the hierarchy of variants 510, such as an active variant, may be shown in the displayed blocks. A user may select aspects of the hierarchy of variants 520 to display. Additional information (e.g., help information associated with possible variations) may be displayed when the user hovers a cursor over a displayed block.

Although user interface 1700 depicts a variety of information, in other implementations, user interface 1700 may depict less information, different information, differently arranged information, and/or additional information than depicted in FIG. 17.

Figure 18:
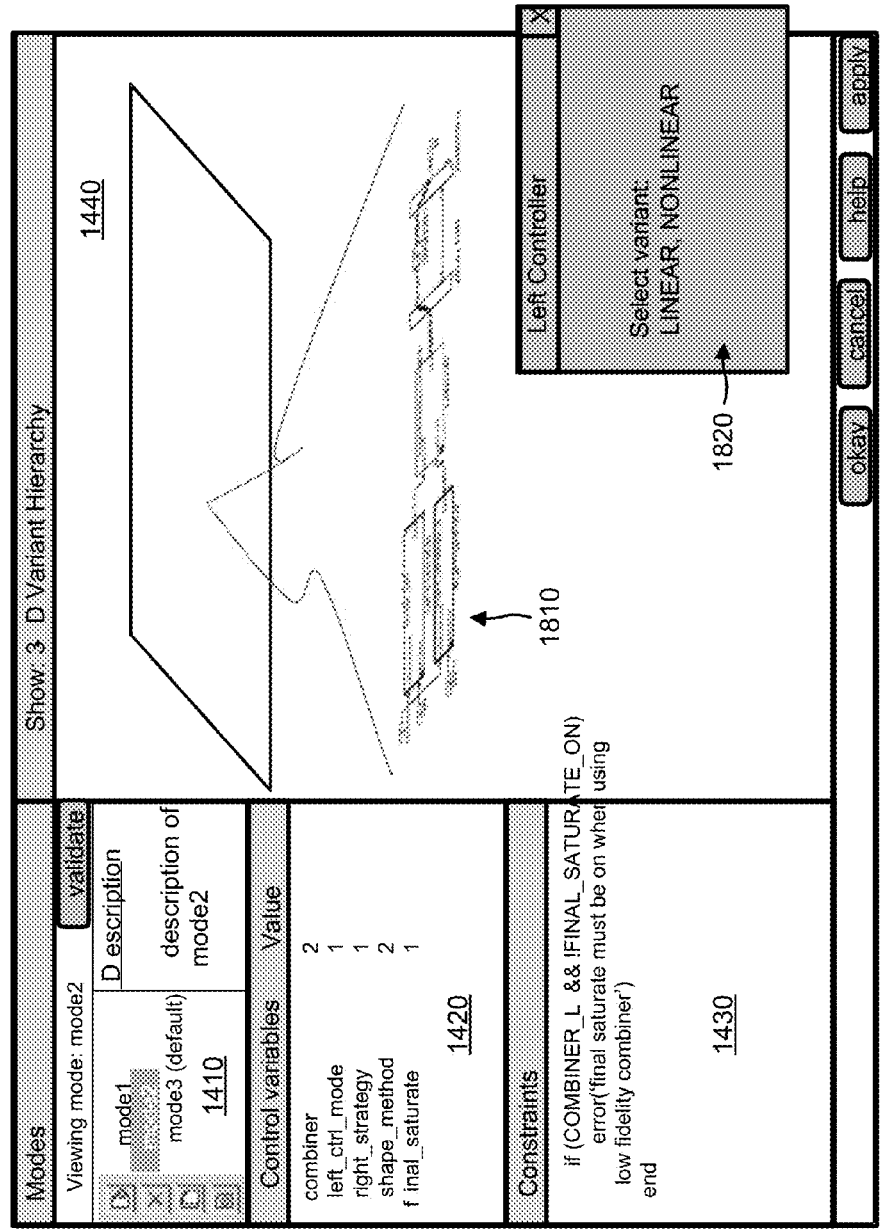

As shown in FIG. 18, user interface 1800 may include a variety of information associated with variant manager tool 530. For example, user interface 1800 may include modes section 1410, control variables section 1420, constraints section 1430, and variant hierarchy section 1440. Modes section 1410, control variables section 1420, constraints section 1430, and variant hierarchy section 1440 may include the features described above in connection with, for example, one or more of FIGS. 14-17.

As further shown in FIG. 18, variant hierarchy section 1440 may provide a three-dimensional graphical view of the hierarchy of TCE model 510 (e.g., rather than a textual view of the hierarchy of TCE model 510), as indicated by reference number 1810. In this view, the hierarchy of TCE model 510 may be shown using either a three-dimensional mapping onto a two-dimensional surface or a three-dimensional virtualization. For example, as shown in FIG. 18, the hierarchy of TCE model 510 may be three-dimensionally mapped onto a two-dimensional surface. A user may zoom in and out of the hierarchy, hide or show blocks of the hierarchy, select one or more variant blocks, etc. For example, if the user selects the left controller block, variant manager tool 530 may display a window 1820 that enables the user to select either a LINEAR variant or a NONLINEAR variant via an override.

For graphical modeling environments that permit nesting of models, when a model is referenced, a specification of a mode for the referenced model may be provided. If the specified mode is not provided, a default mode may be used. When a user utilizes variant manager tool 530 to navigate to the referenced model, either a new instance of variant manager tool 530 may be provided for the referenced model, or the contents of variant manager tool 530 may be replaced for the referenced model.

In one example implementation, a user of variant manager tool 530 may select a block listed in variant hierarchy section 1440, and variant manager tool 530 may display TCE model 510. For example, if the user selects the left controller block in variant hierarchy section 1440, variant manager tool 530 may display an appropriate view in TCE model 510. Alternatively, or additionally, when utilizing TCE model 510, if the user selects a variant block, a context menu may be displayed that permits the user to open variant manager tool 530 with a corresponding block in variant hierarchy section 1440.

Although user interface 1800 depicts a variety of information, in other implementations, user interface 1800 may depict less information, different information, differently arranged information, and/or additional information than depicted in FIG. 18.

Example Process

Figure 19:
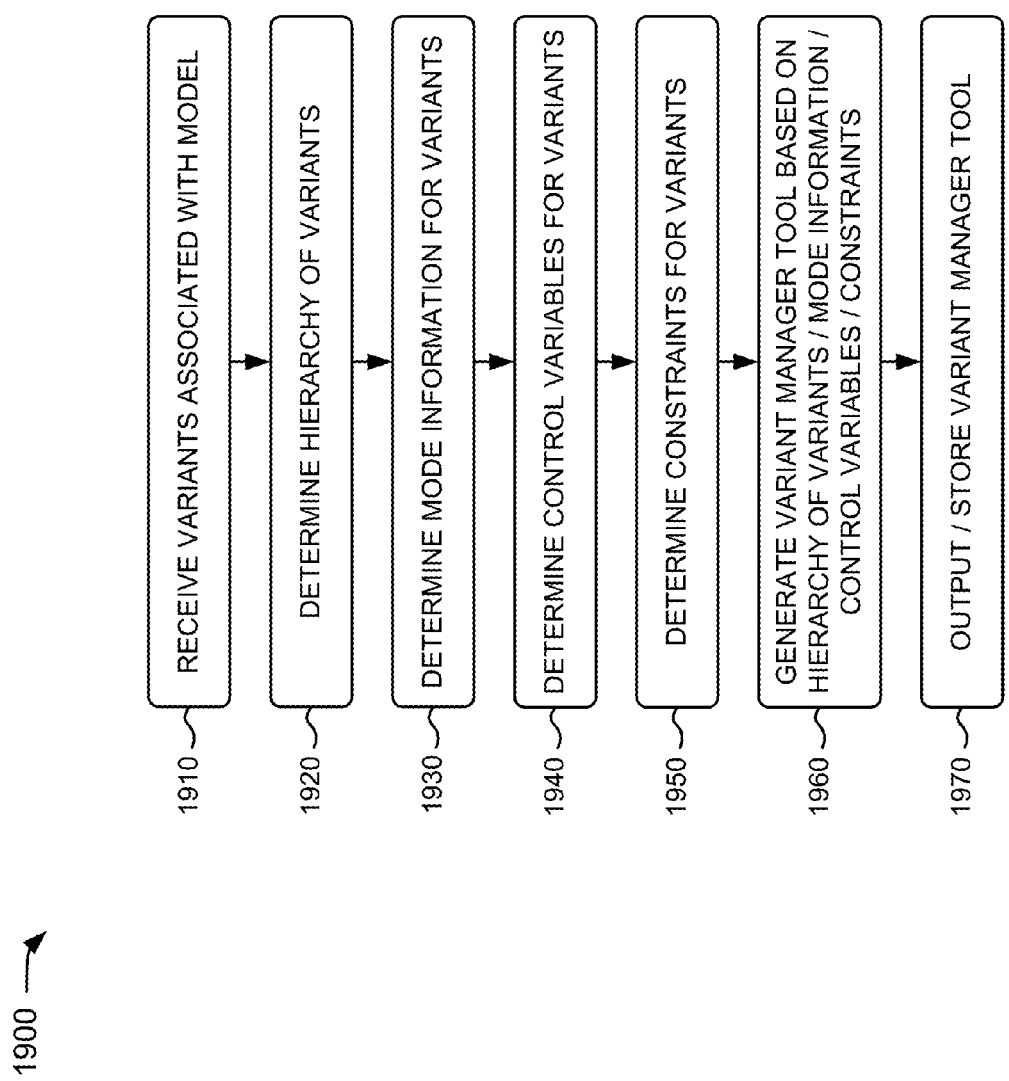
FIGS. 19-21 are flow charts of an example process for managing variants in a graphical modeling environment.
Figure 20:
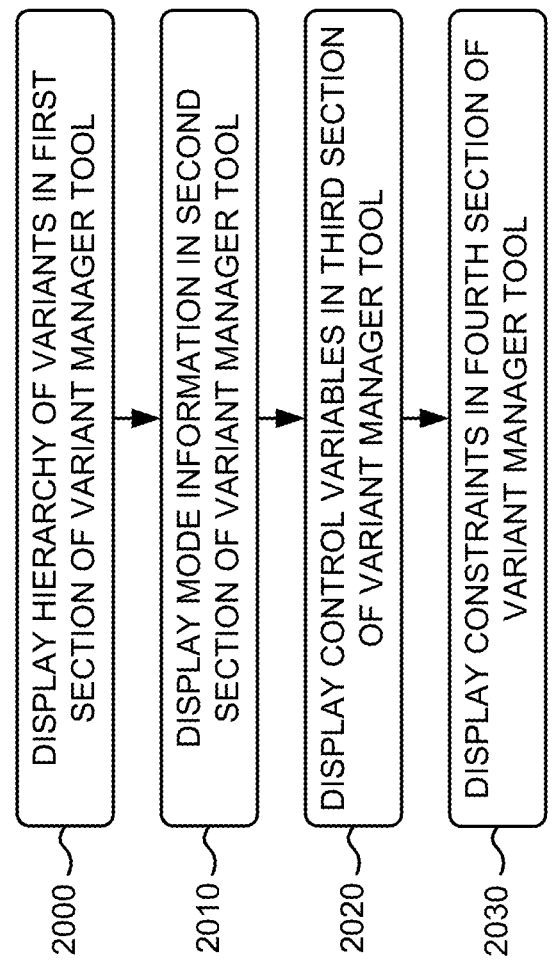
Figure 21:
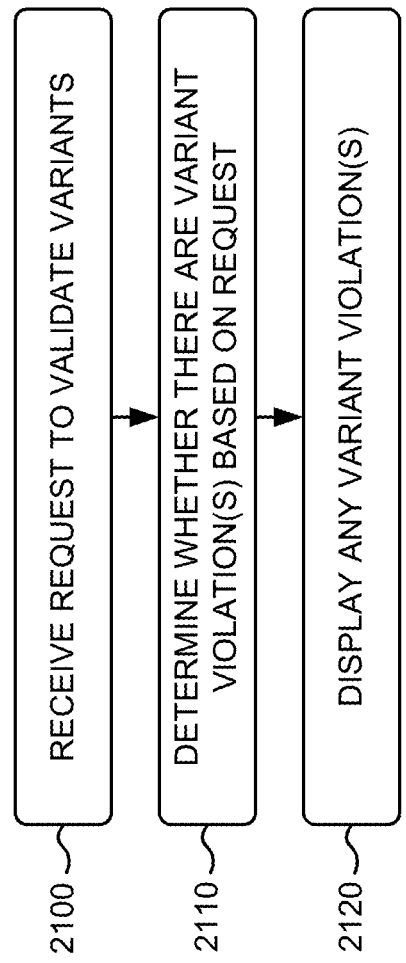

FIGS. 19-21 are flow charts of an example process 1900 for managing variants in a graphical modeling environment. In one implementation, process 1900 may be performed by client device 210/TCE 240. Alternatively, or additionally, process 1900 may be performed by another device or a group of devices separate from or including client device 210/TCE 240, such as server device 220.

As shown in FIG. 19, process 1900 may include receiving variants associated with a model (block 1910), determining a hierarchy of the variants (block 1920), and determining mode information for the variants (block 1930). For example, in an implementation described above in connection with FIG. 5, variant manager component 500 may receive model 510 generated by TCE 240. TCE model 510 may include a block diagram model with one or more model elements (e.g., blocks), one or more inputs, and one or more outputs. TCE model 510 may include multiple variants 520 that enable an individual portion of TCE model 510 to have multiple implementations that may be swapped in and out by a user of the TCE. Variant manager component 500 may determine a hierarchy of variants 520 included in TCE model 510, and may determine modes for variants 520 included in TCE model 510. The hierarchy of variants 520 may include a listing of variants 520 provided in an order according to the hierarchy of elements of TCE model 510 with which variants 520 are associated. A mode of a variant 520 may include a subset of a number of variant permutations. The modes for variants 520 may permit explicit overriding of particular variants 520 so that the other variants 520 may be activated.

As further shown in FIG. 19, process 1900 may include determining control variables for the variants (block 1940), and determining constraints for the variants (block 1950). For example, in an implementation described above in connection with FIG. 5, variant manager component 500 may determine control variables for variants 520, and may determine constraints for variants 520. The control variables may include variables used to control which variants 520 are active in TCE model 510. The constraints may ensure that conflicting variant 520 conditions are identified and prevented (e.g., a U.S. emissions system cannot be combined with a drive train for a California car since U.S. emissions standards do not meet California emissions standards).

Returning to FIG. 19, process 1900 may include generating a variant manager tool based on the hierarchy of the variants, the mode information, the control variables, and the constraints (block 1960), and outputting and/or storing the variant manager tool (block 1970). For example, in an implementation described above in connection with FIG. 5, variant manager component 500 may generate variant manager tool 530 based on the hierarchy of variants 520, the modes for variants 520, the control variables for variants 520, and/or the constraints for variants 520. In one example, variant manager tool 530 may be hierarchical and may be associated with one or more TCE models 510. Variant manager component 500 may output (e.g., display) and/or store variant manager tool 530.

Process block 1970 may include the process blocks depicted in FIG. 20. As shown in FIG. 20, process block 1970 may include displaying the hierarchy of the variants in a first section of the variant manager tool (block 2000), displaying the mode information in a second section of the variant manager tool (block 2010), displaying the control variables in a third section of the variant manager tool (block 2020), and displaying the constraints in a fourth section of the variant manager tool (block 2030). For example, in an implementation described above in connection with FIG. 5, variant manager tool 530 may include a variant hierarchy section (e.g., a window) for displaying the hierarchy of variants 520, and a modes section for displaying the modes for variants 520. The hierarchy of variants 520 may be displayed and navigable via a tree view, a two-dimensional graph, a three-dimensional graph, etc. Alternatively, or additionally, variant manager tool 530 may include a control variables section that displays the control variables for variants 520, and a constraints section that displays the constraints for variants 520.

Alternatively, or additionally, process block 1970 may include the process blocks depicted in FIG. 21. As shown in FIG. 21, process block 1970 may include receiving a request to validate the variants (block 2100), determining whether there are variant violation(s) based on the request (block 2110), and displaying any variant violation(s) (block 2120). For example, in an implementation described above in connection with FIG. 6, validate component 620 may receive (e.g., from a user of TCE 240) a request to validate variants 520 in TCE model 510, and may determine whether there are any variant violation(s) based on the request. A variant violation may occur when constraints 645 are violated by variants 520, when control variables 640 set incorrect variants 520 to an active state, etc. Validate component 620 may display any variant violation(s) (e.g., validation information 650) to the user of TCE 240.

CONCLUSION

Systems and/or methods described herein may provide for management of variants in a graphical modeling environment. In one example, the systems and/or methods may manage the variants by providing defined modes that are subsets of variant permutations, and by enabling the modes to be displayed and/or navigated. The systems and/or methods may enable constraints to be defined for the variants to ensure that incompatible variant selections are identified.

The foregoing description of implementations provides illustration and description, but is not intended to be exhaustive or to limit the implementations to the precise form disclosed. Modifications and variations are possible in light of the above teachings or may be acquired from practice of the implementations.

For example, while series of blocks have been described with regard to FIGS. 19-21, the blocks and/or the order of the blocks may be modified in other implementations. Further, non-dependent blocks may be performed in parallel.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain portions of the implementations may be implemented as a "component" that performs one or more functions. This component may include hardware, such as a processor, an application-specific integrated circuit (ASIC), or a field-programmable gate array (FPGA), or a combination of hardware and software.

Even though particular combinations of features are recited in the claims and/or disclosed in the specification, these combinations are not intended to limit the disclosure of the specification. In fact, many of these features may be combined in ways not specifically recited in the claims and/or disclosed in the specification. Although each dependent claim listed below may directly depend on only one other claim, the disclosure of the specification includes each dependent claim in combination with every other claim in the claim set.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A device comprising:
one or more processors to:
receive variants associated with a model generated in a graphical modeling environment,
determine a hierarchy of the variants based on a hierarchy of the model,
receive mode information for the variants,
the mode information indicating at least one mode including a subset of a number of variant permutations,
receive control variables for the variants,
the control variables defining which variants are active in the at least one mode,
generate a variant manager tool based on the hierarchy of the variants, the mode information, and the control variables,
the variant manager tool including a user interface to set properties for the control variables that define which variants are active for a selected mode of the at least one mode,
receive constraints for the at least one mode,
the constraints enabling model correctness by identifying conflicts between the variants,
determine whether the variants violate the constraints, and
output or store variant information and any determined variant violations via the variant manager tool.

2. The device of claim 1, where the one or more processors are further to:

receive a request to validate the variants, and
provide, based on the request, any active and inactive variants for display.

3. The device of claim 2, where the one or more processors when determining whether the variants violate the constraints, are to:
receive, based on the request, whether the variants violate the constraints.

4. The device of claim 1, where the one or more processors are further to:
automatically provide any active and inactive variants for display.

5. The device of claim 4, where the one or more processors when determining whether the variants violate the constraints, are to:
automatically determine whether the variants violate the constraints.

6. The device of claim 1, where the one or more processors are further to:
provide the hierarchy of the variants for display in a first section of the variant manager tool,
provide the mode information for display in a second section of the variant manager tool,
provide the control variables for display in a third section of the variant manager tool, and
provide the constraints for display in a fourth section of the variant manager tool,
the first section, the second section, the third section, and the fourth section being provided for display within the user interface at a same time.

7. The device of claim 6, where the hierarchy of the variants includes the hierarchy of the model and is provided for display in a textual format.

8. The device of claim 6, where the hierarchy of the variants is provided for display in a textual format.

9. The device of claim 6, where the hierarchy of the variants is provided for display in one of:
a two-dimensional graphical format, or
a three-dimensional graphical format.

10. A method, comprising:
receiving variants associated with a model generated in a graphical modeling environment,
the receiving the variants being performed by one or more devices;
determining a hierarchy of the variants based on a hierarchy of the model,
the determining the hierarchy of the variants being performed by the one or more devices;
receiving mode information for the variants,
the mode information indicating at least one mode including a subset of a number of variant permutations,
the receiving the mode information being performed by the one or more devices;
receiving control variables for the variants,
the control variables defining which variants are active in the at least one mode,
the receiving the control variables being performed by the one or more devices;
receiving constraints for the at least one mode,
the constraints enabling conflicts between the variants to be identified,
the receiving the constraints being performed by the one or more devices;
generating a variant manager tool based on the hierarchy of the variants, the mode information, the control variables, and the constraints,
the variant manager tool including a user interface to set properties for the control variables that define which variants are active for a selected mode of the at least one mode,
the generating the variant manager tool being performed by the one or more devices;
determining whether the variants violate the constraints,
the determining whether the variants violate the constraints being performed by the one or more devices; and
outputting or storing the variant manager tool,
the outputting or storing including outputting or storing information indicating any determined variant violations,
the outputting or storing the variant manager tool being performed by the one or more devices.

11. The method of claim 10, further comprising:
receiving a request to validate the variants;
where determining whether the variants violate the constraints is based on the request; and
where the outputting or storing includes providing any determined variant violations for display.

12. The method of claim 10,
where determining whether the variants violate the constraints includes automatically determining whether the variants violate the constraints; and
where the output and storing includes providing any determined variant violations for display.

13. The method of claim 10, further comprising:
providing the hierarchy of the variants for display in a first section of the variant manager tool;
providing the mode information for display in a second section of the variant manager tool;
providing the control variables for display in a third section of the variant manager tool; and
providing the constraints for display in a fourth section of the variant manager tool,
the first section, the second section, the third section, and the fourth section being provided for display within the user interface at a same time.

14. The method of claim 13, where the hierarchy of the variants includes the hierarchy of the model and is provided for display in a textual format.

15. The method of claim 13, where the hierarchy of the variants is provided for display in a textual format.

16. The method of claim 13, where the hierarchy of the variants is provided for display in one of:
a two-dimensional graphical format, or
a three-dimensional graphical format.

17. One or more non-transitory computer-readable media, comprising:
one or more instructions that, when executed by a processor of a device, cause the processor to:
receive variants associated with a model generated in a graphical modeling environment,
determine a hierarchy of the variants based on a hierarchy of the model, receive mode information for the variants,
the mode information indicating at least one mode including a subset of a number of variant permutations,
receive control variables for the variants,
the control variables defining which variants are active in the at least one mode,
receive constraints for the at least one mode,
the constraints enabling model correctness by identifying conflicts between the variants, determine whether the variants violate the constraints, generate a variant manager tool based on the hierarchy of the variants, the mode information, the control variables, and the constraints, the variant manager tool including a user interface to set properties for the control variables that define which variants are active for a selected mode of the at least one mode, and output or store the variant manager tool, the variant manager tool providing any determined variant violations for display.

18. The one or more non-transitory computer-readable media of claim 17, further comprising:

one or more instructions that, when executed by the processor, cause the processor to:

receive a request to validate the variants, where the one or more instructions, that cause the processor to determine whether the variants violate the constraints, cause the processor to:

determine, based on the request, whether the variants violate the constraints.

19. The one or more non-transitory computer-readable media of claim 17, where the one or more instructions, that cause the processor to determine whether the variants violate the constraints, cause the processor to:

automatically determine whether the variants violate the constraints.

20. The one or more non-transitory computer-readable media of claim 17, further comprising:

one or more instructions that, when executed by the processor, cause the processor to:

provide the hierarchy of the variants for display in a first section of the variant manager tool, provide the mode information for display in a second section of the variant manager tool, provide the control variables for display in a third section of the variant manager tool, and provide the constraints for display in a fourth section of the variant manager tool, the first section, the second section, the third section, and the fourth section being provided for display within the user interface at a same time.

21. The one or more non-transitory computer-readable media of claim 20, where the hierarchy of the variants includes the hierarchy of the model and is provided for display in a textual format.

22. The one or more non-transitory computer-readable media of claim 20, where the hierarchy of the variants is provided for display in one of:

a textual format, a two-dimensional graphical format, or a three-dimensional graphical format.

* * * * *